United States Patent [19]
Arsenault et al.

[11] Patent Number: 5,894,310
[45] Date of Patent: Apr. 13, 1999

[54] INTELLIGENT SHAPES FOR AUTHORING THREE-DIMENSIONAL MODELS

[75] Inventors: David Arsenault, Ithaca, N.Y.; David Phelan, Marietta, Ga.; Larry Felser, Ithaca, N.Y.

[73] Assignee: Visionary Design Systems, Inc., Santa Clara, Calif.

[21] Appl. No.: 08/635,293

[22] Filed: Apr. 19, 1996

[51] Int. Cl.$^6$ ................................................. G06T 1/00
[52] U.S. Cl. ........................................ 345/433; 345/419
[58] Field of Search .............................. 345/419–420, 345/427, 428, 433, 435–439, 441, 333, 335

[56] References Cited

U.S. PATENT DOCUMENTS

| | | | |
|---|---|---|---|
| 4,813,013 | 3/1989 | Dunn | 345/333 |
| 4,974,174 | 11/1990 | Kleinman | 345/433 |
| 5,261,041 | 11/1993 | Susman | 395/152 |
| 5,297,241 | 3/1994 | Hirr, Jr. et al. | 345/427 |
| 5,553,209 | 9/1996 | Johnson et al. | 345/433 |
| 5,583,977 | 12/1996 | Seidl | 345/433 |
| 5,583,984 | 12/1996 | Conrad et al. | 345/340 |
| 5,586,237 | 12/1996 | Baecker et al. | 345/433 |
| 5,611,031 | 3/1997 | Hertzfield et al. | 345/433 |
| 5,642,475 | 6/1997 | Itoh et al. | 345/433 |
| 5,649,086 | 7/1997 | Belfer et al. | 345/441 |
| 5,701,403 | 12/1997 | Watanabe et al. | 345/419 |
| 5,771,044 | 6/1998 | Cragun et al. | 345/420 |
| 5,825,365 | 10/1998 | Hirota et al. | 345/433 |

OTHER PUBLICATIONS

Visio 2.0 Manual, "Using Visio," Shapeware Corporation, 1993.

Manual, "Developing Visio Shapes," Shapeware Corporation, 1994.

*Primary Examiner*—Joseph H. Feild
*Attorney, Agent, or Firm*—Nixon & Vanderhye P.C.

[57] ABSTRACT

Shapes and solids modeled by a 3-D computer graphics system have "intelligence", i.e., the shape typically includes a wide variety of characteristics in addition to geometric (e.g., size and positional) information. These additional characteristics permit a user to manipulate 3-D shapes intuitively using a graphical user interface providing "drag and drop" capabilities—reducing the number of factors the user must worry about, saving a lot of time and user frustration, and allowing even non-technical, unskilled users to rapidly and efficiently create impressive images. A component-based architecture may expose any of multiple, alternate representations of the same shape depending on the particular need or application to provide an "intelligent load" that is especially powerful and advantageous in remote interactive imaging applications (e.g., via the Internet) where data transfer and/or load times must be minimized. The shape architecture is hierarchical and extensible—providing great flexibility and expandability.

63 Claims, 35 Drawing Sheets

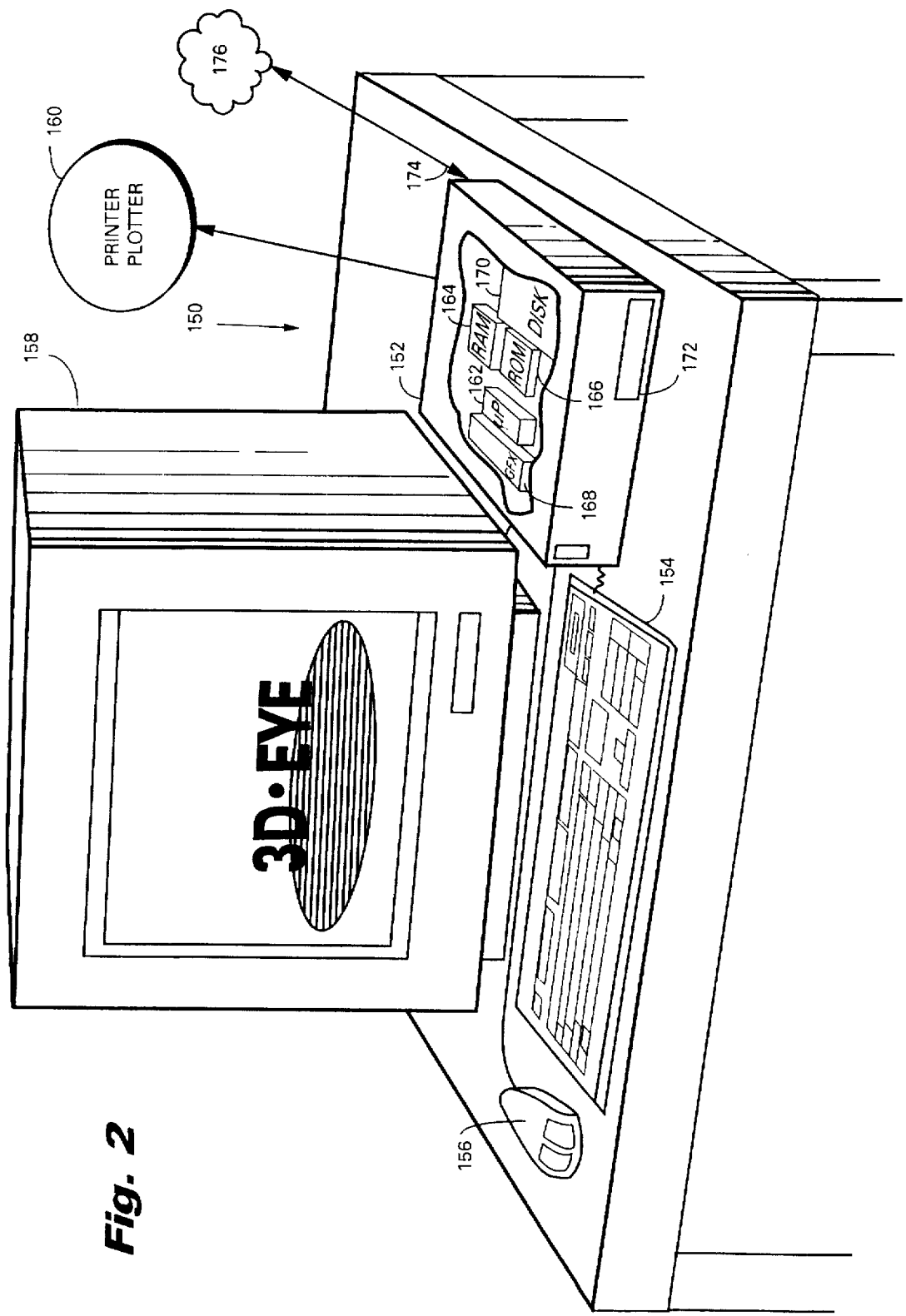

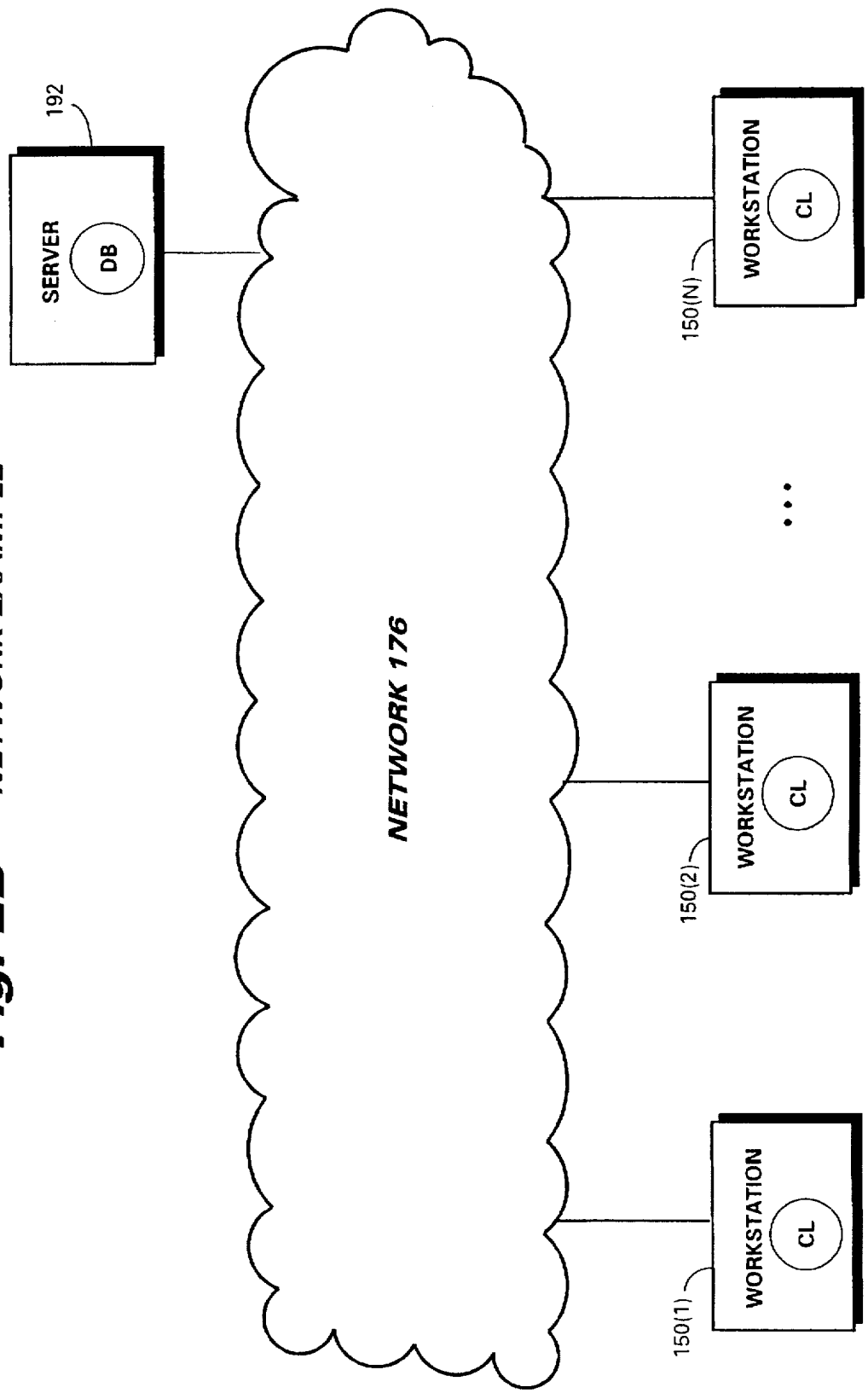
Fig. 2B  NETWORK EXAMPLE

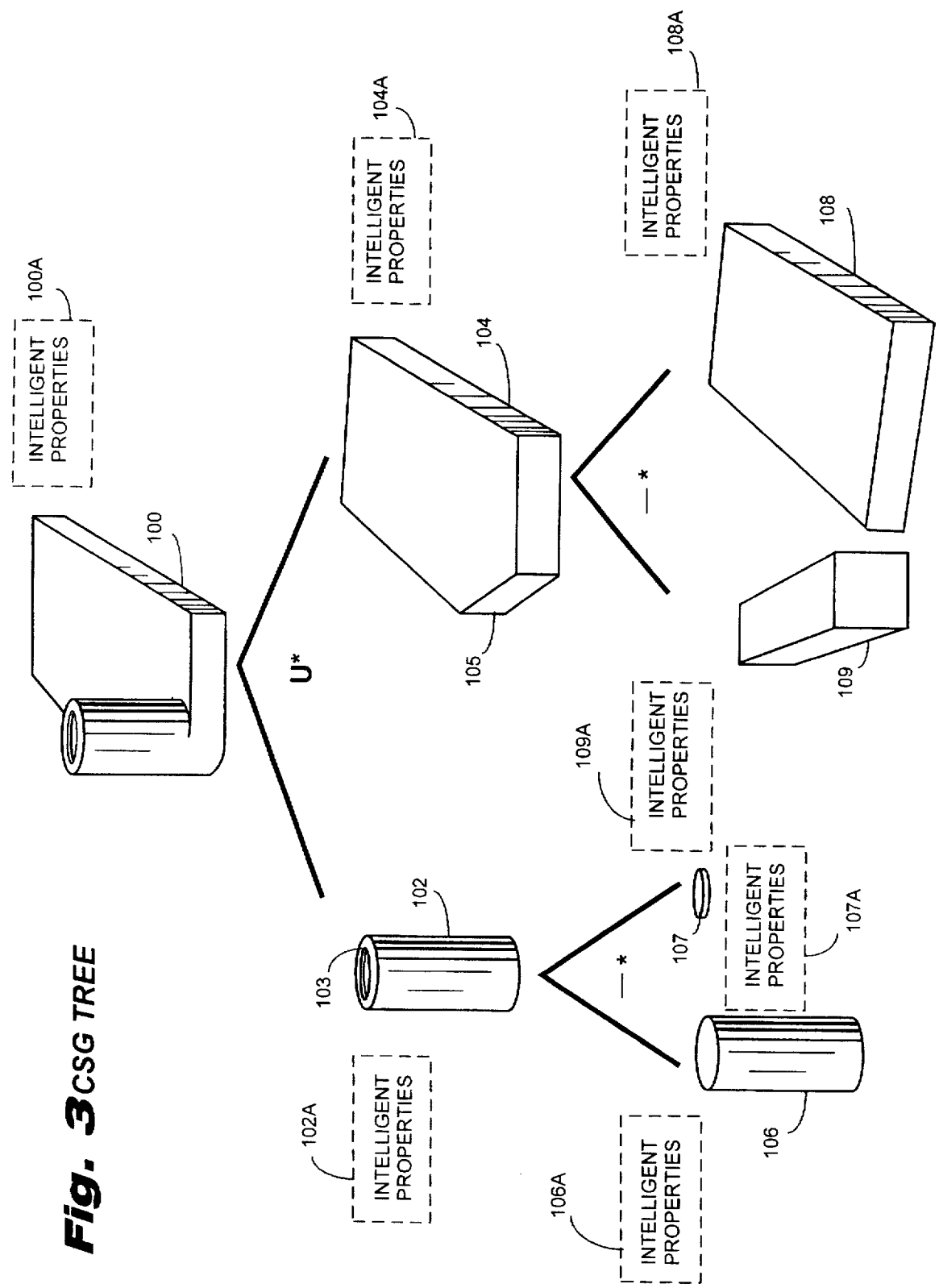
Fig. 3 CSG TREE

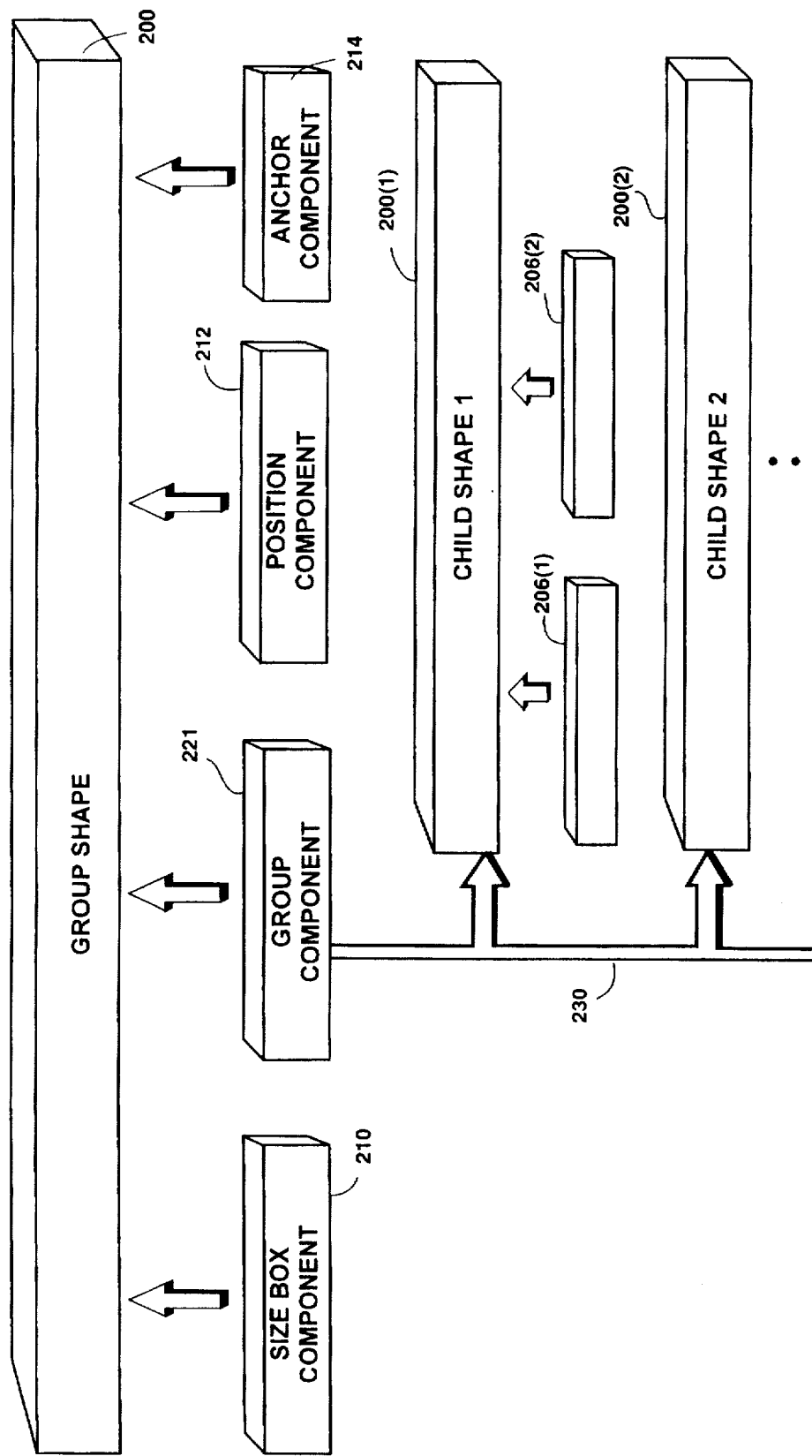
Fig. 5 *GROUP SHAPE*

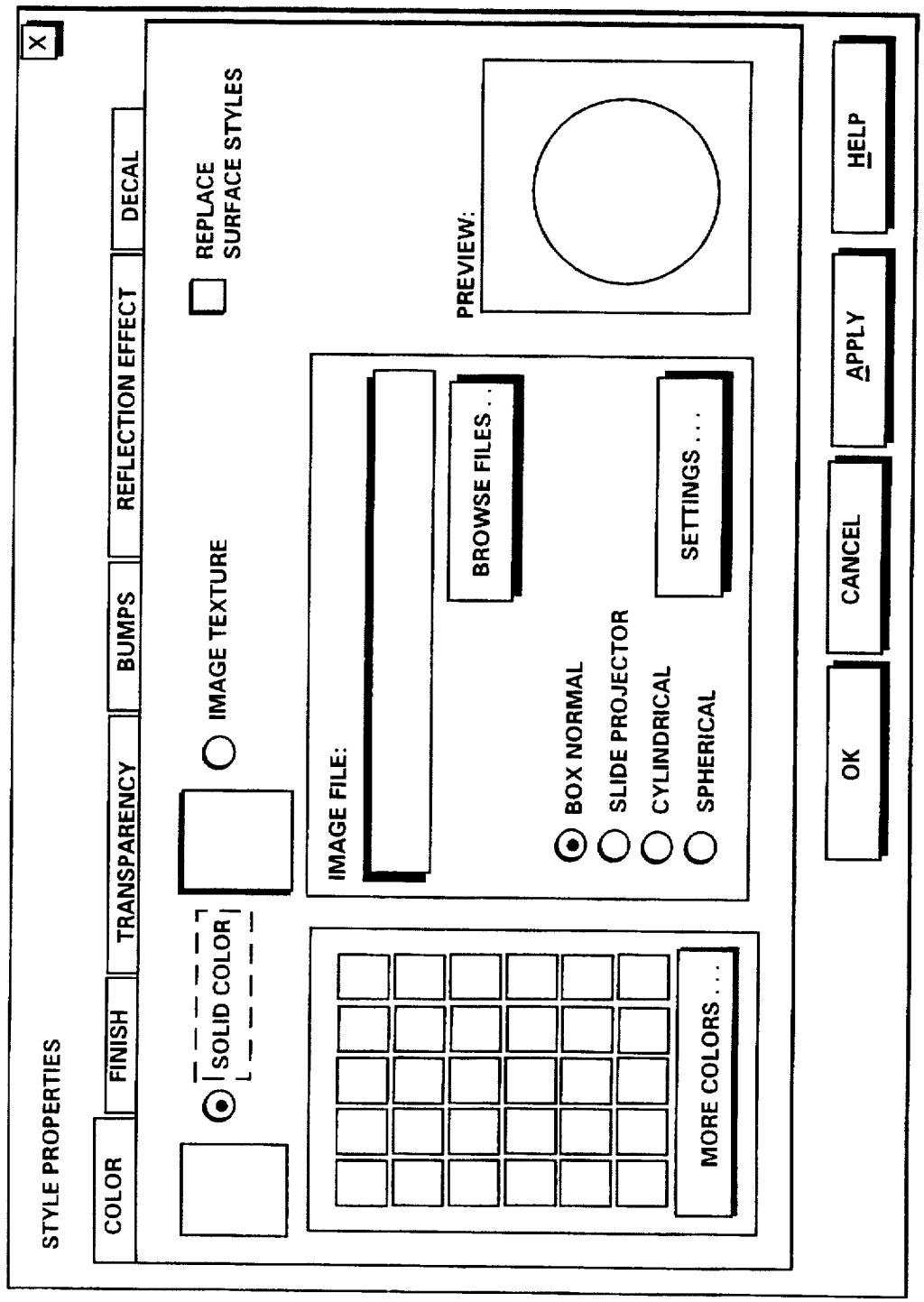
Fig. 5A   USER TOOL

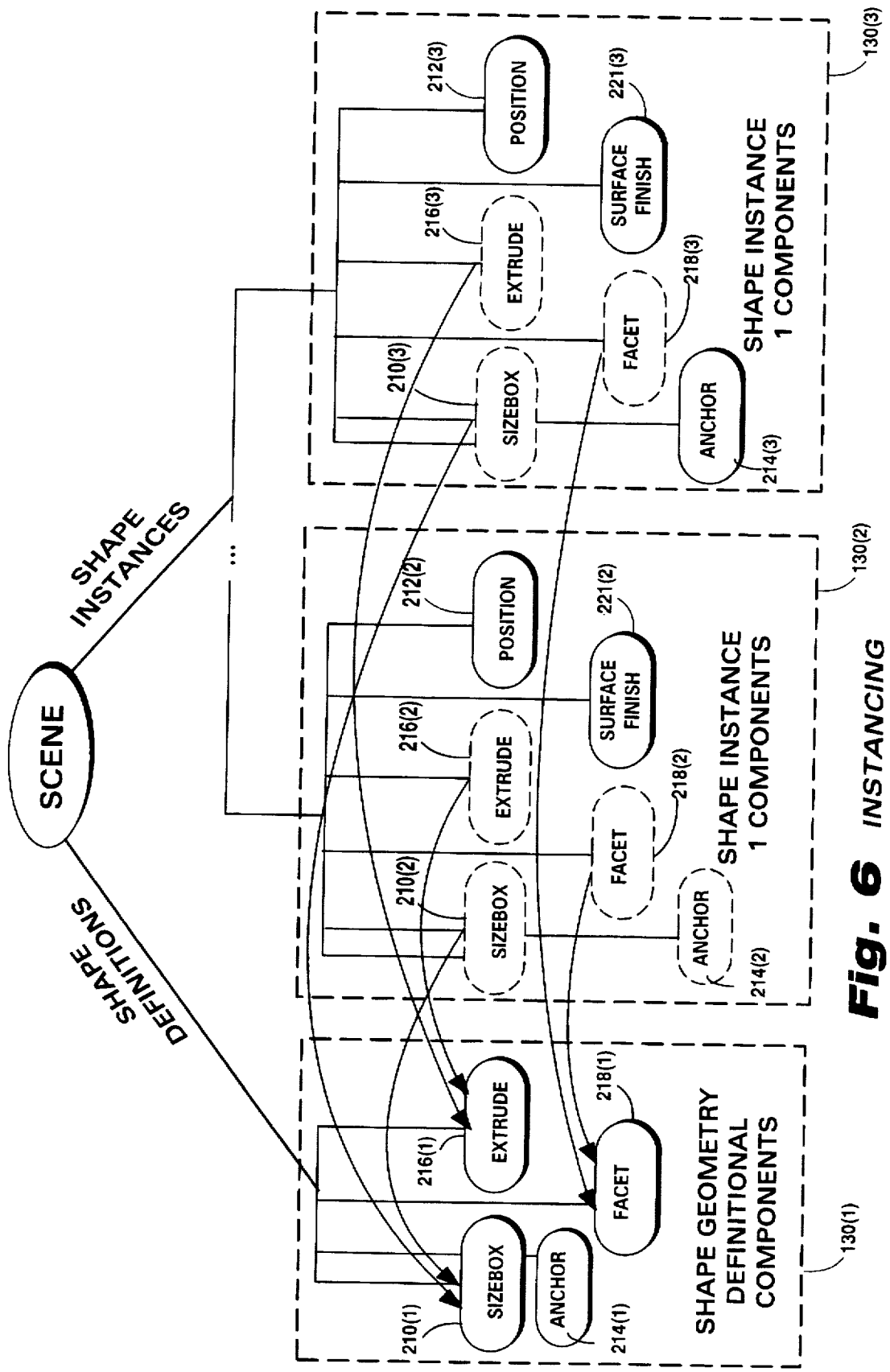
Fig. 6 INSTANCING

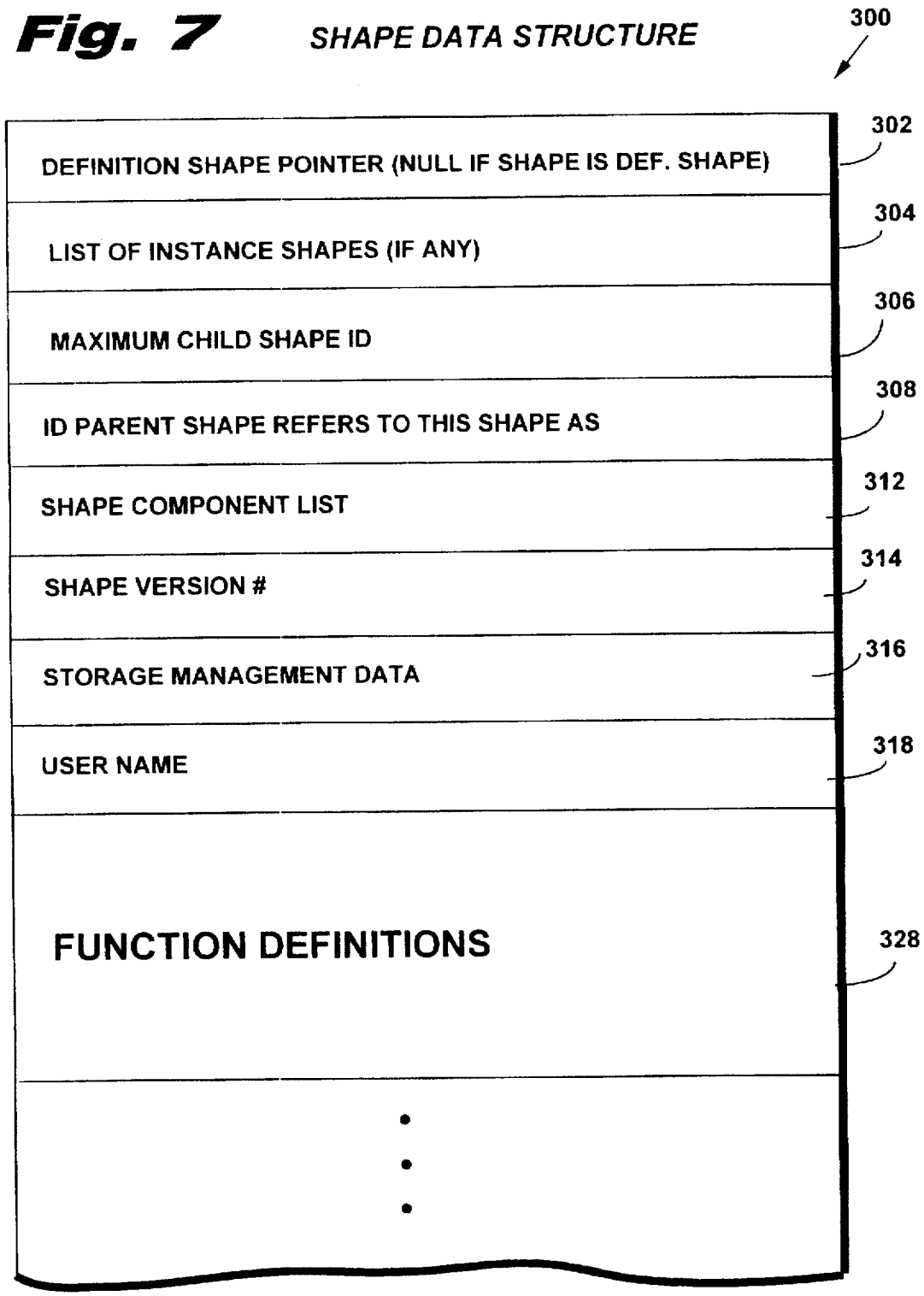
Fig. 7  SHAPE DATA STRUCTURE

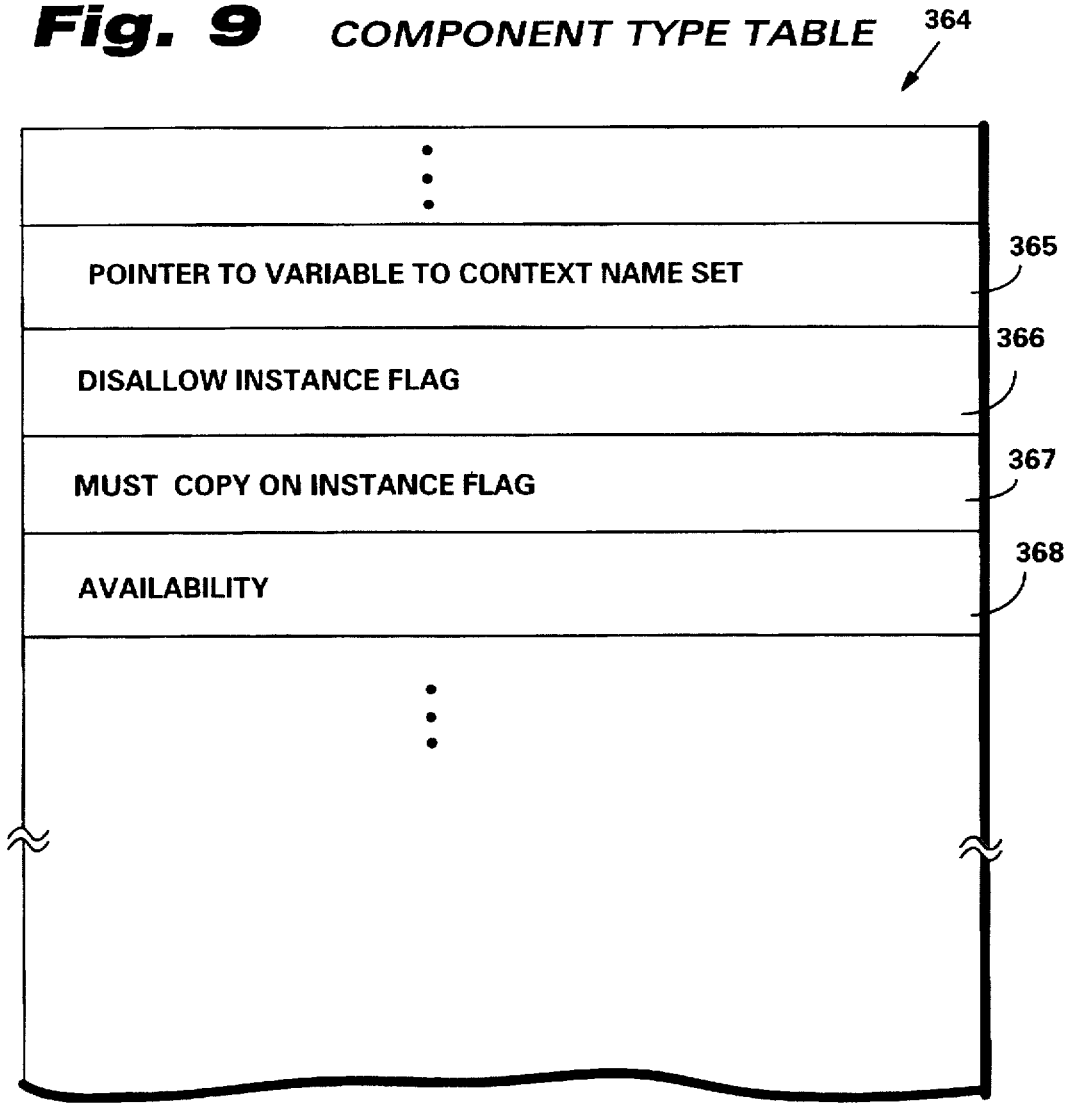
Fig. 9 COMPONENT TYPE TABLE

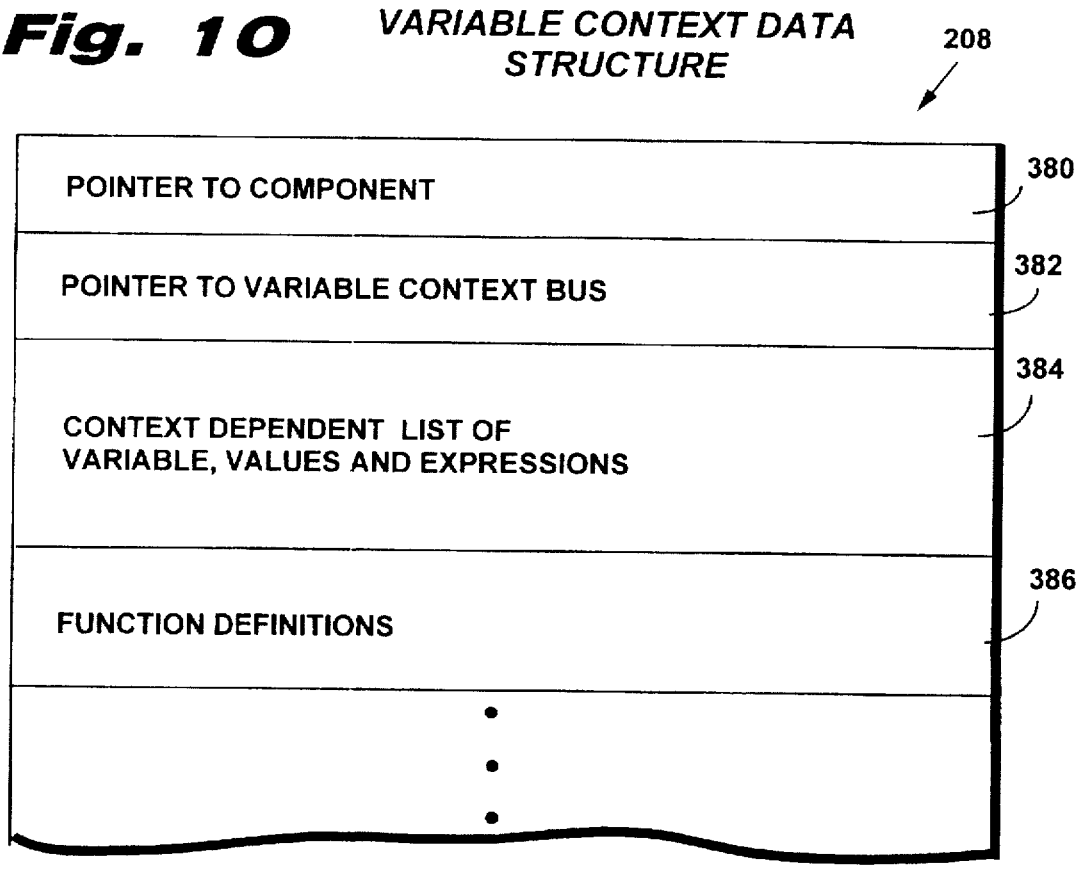
Fig. 10  VARIABLE CONTEXT DATA STRUCTURE

Fig. 10A ANCHOR COMPONENT VARIABLE CONTEXT BLOCK 208
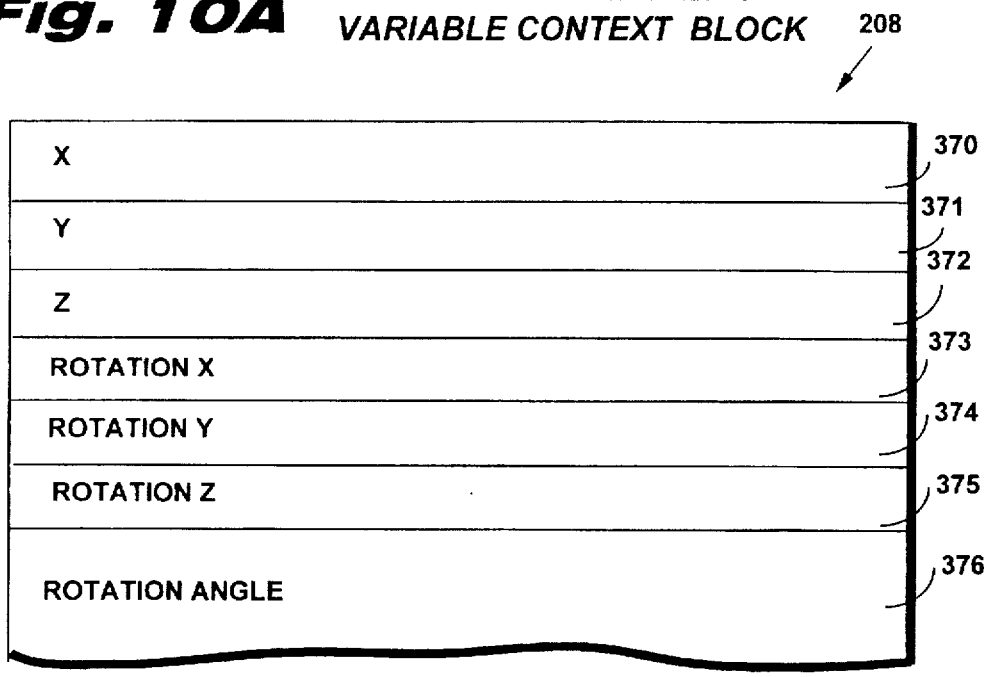
Fig. 10B ANCHOR
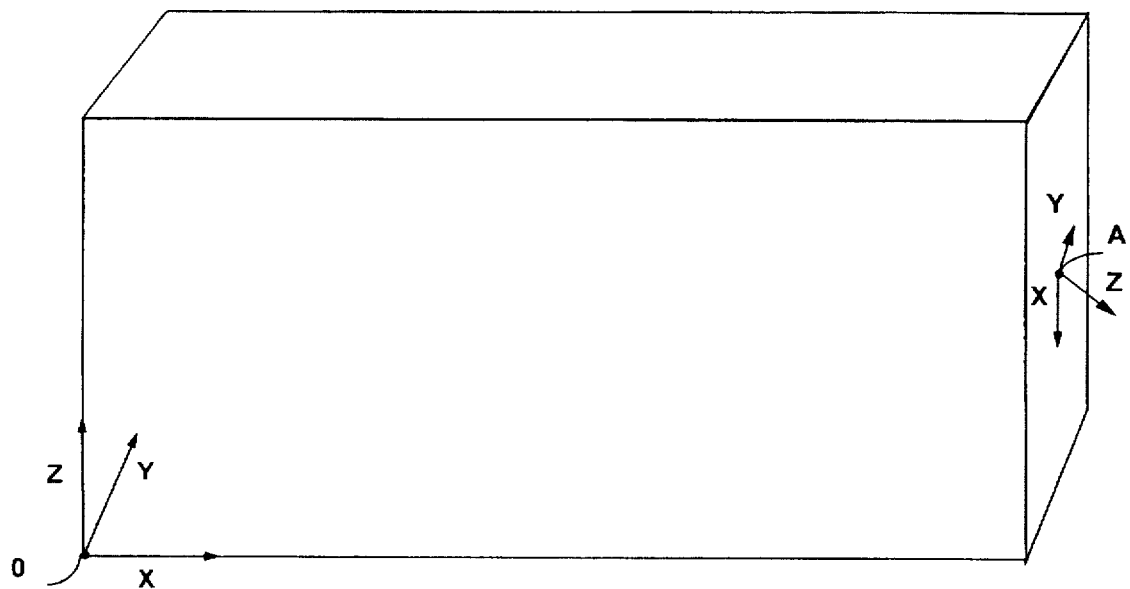

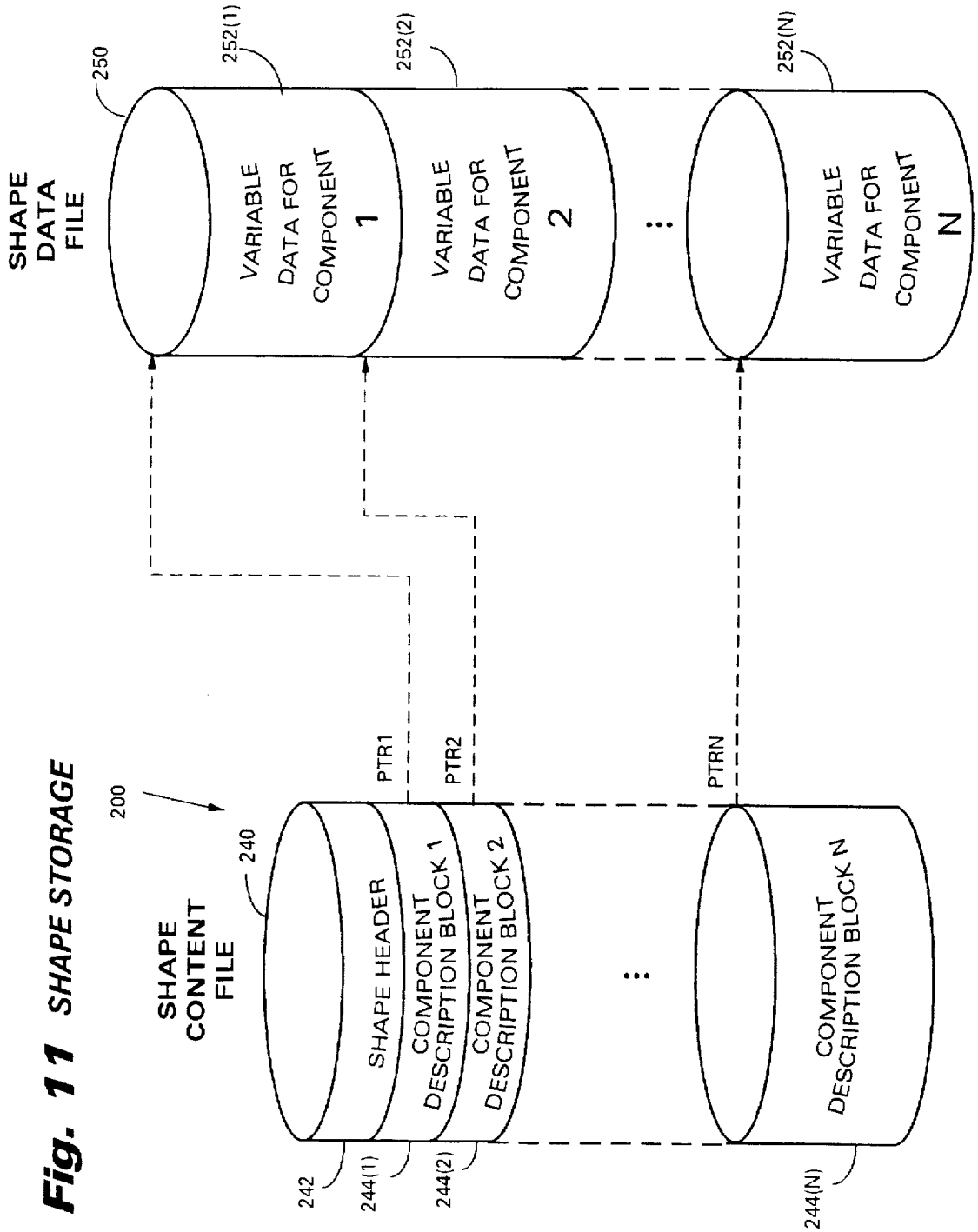
Fig. 11 SHAPE STORAGE

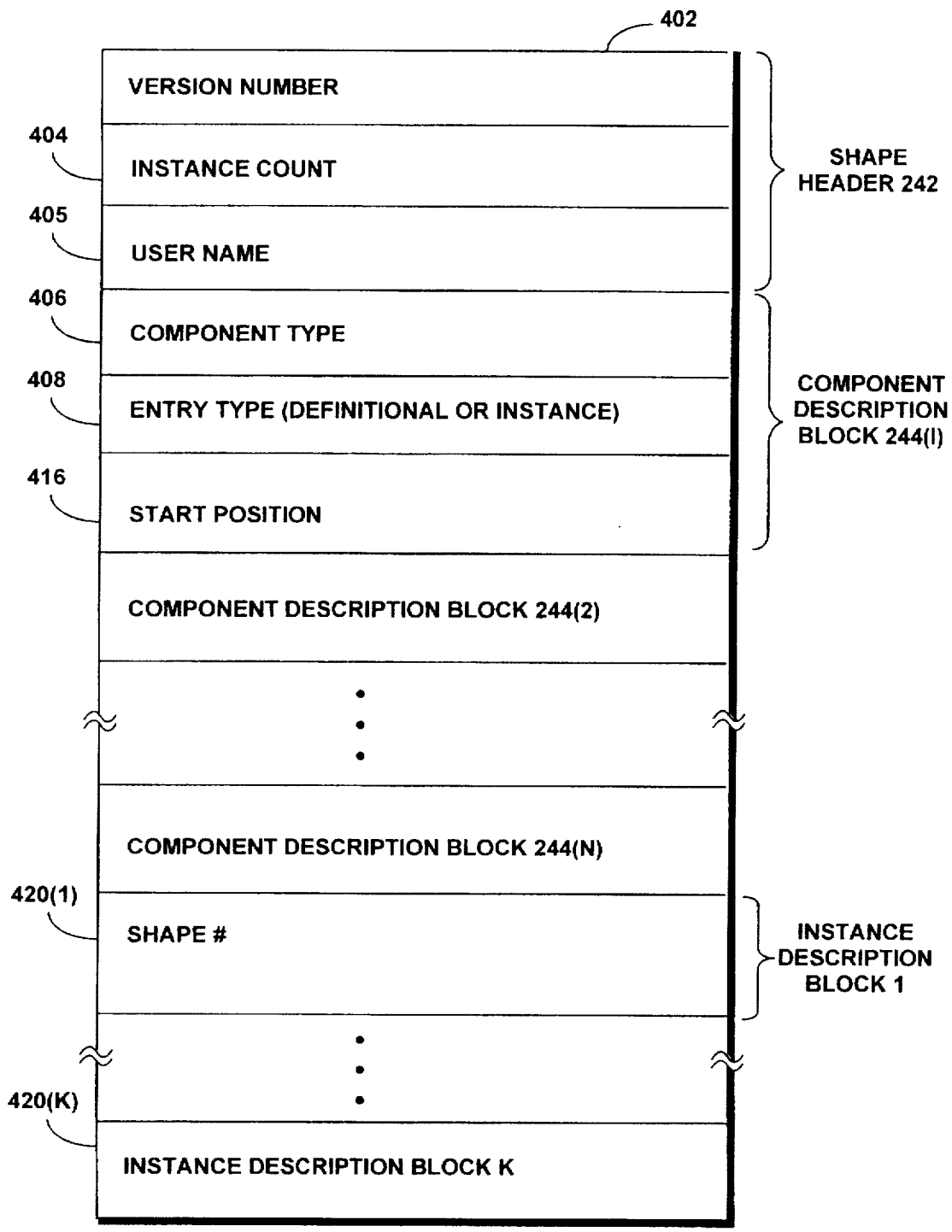
Fig. 12   SHAPE CONTENT FILE 240

Fig. 14 CREATE NEW SHAPE 600

Fig. 15 ADD COMPONENT

SAVE SHAPE

SAVE COMPONENT

LOAD SHAPE

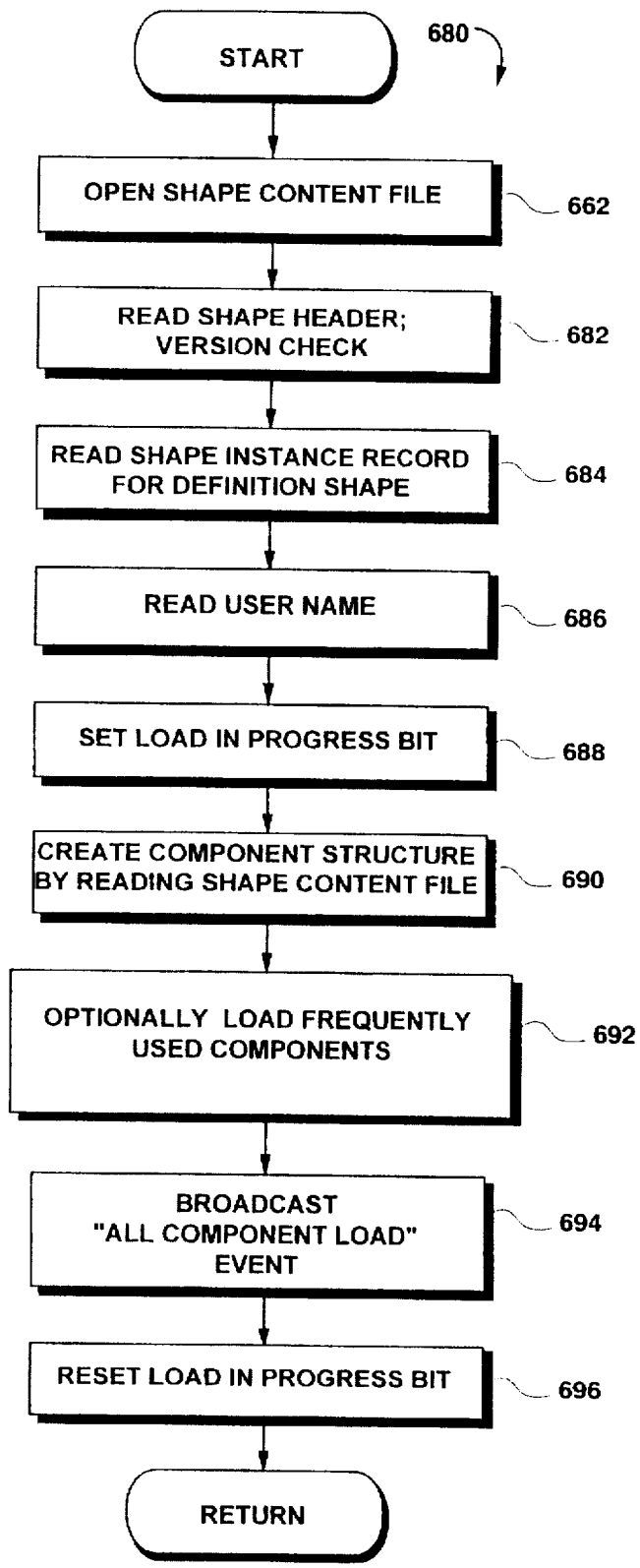
Fig. 18A   DETAILED LOAD SHAPE

GET COMPONENT OF SHAPE

BROADCAST EVENT

HIT TEST SHAPE

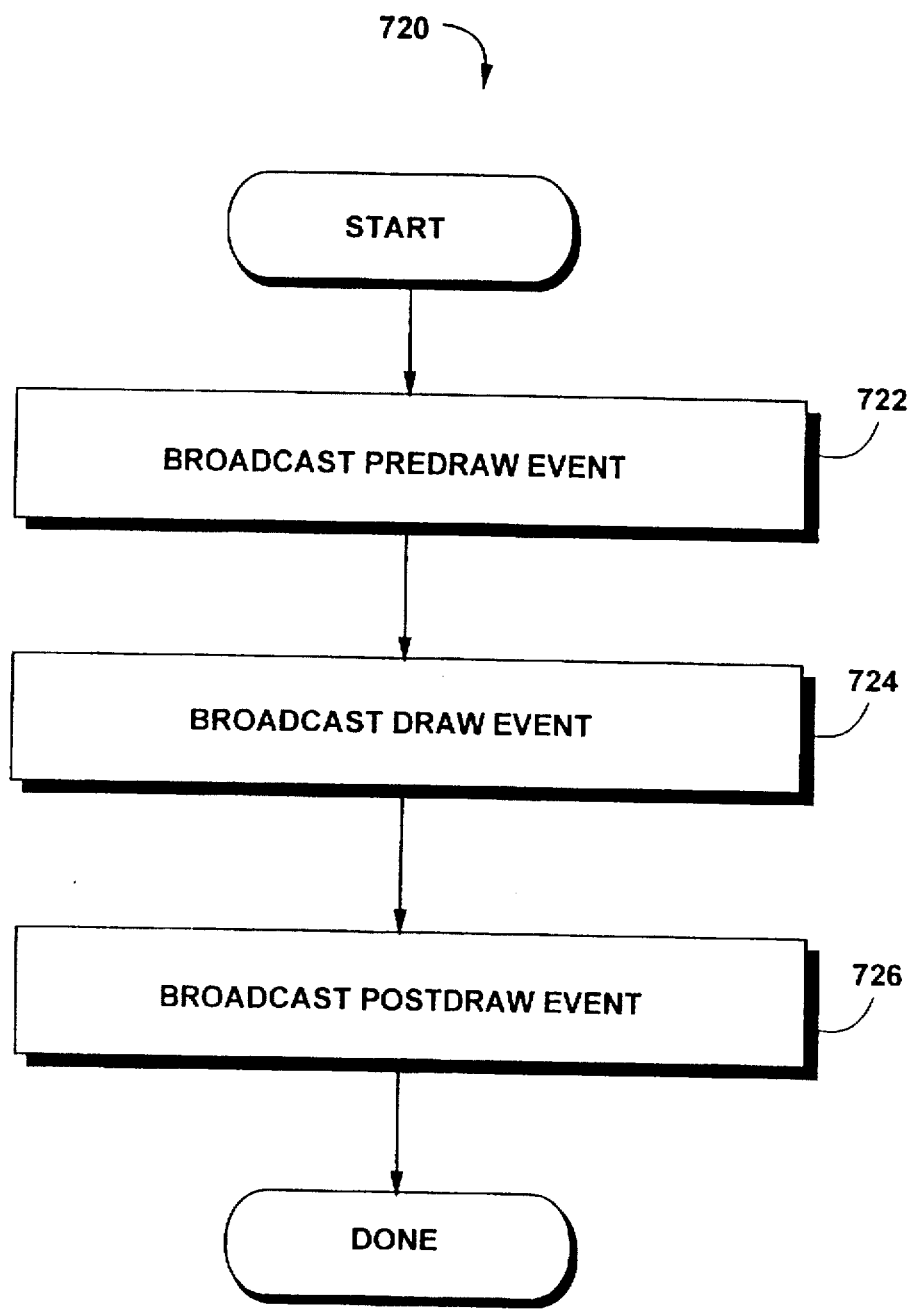
Fig. 21   DRAW SHAPE

Fig. 22 BASIC FLOW - SIMPLE MODIFICATION
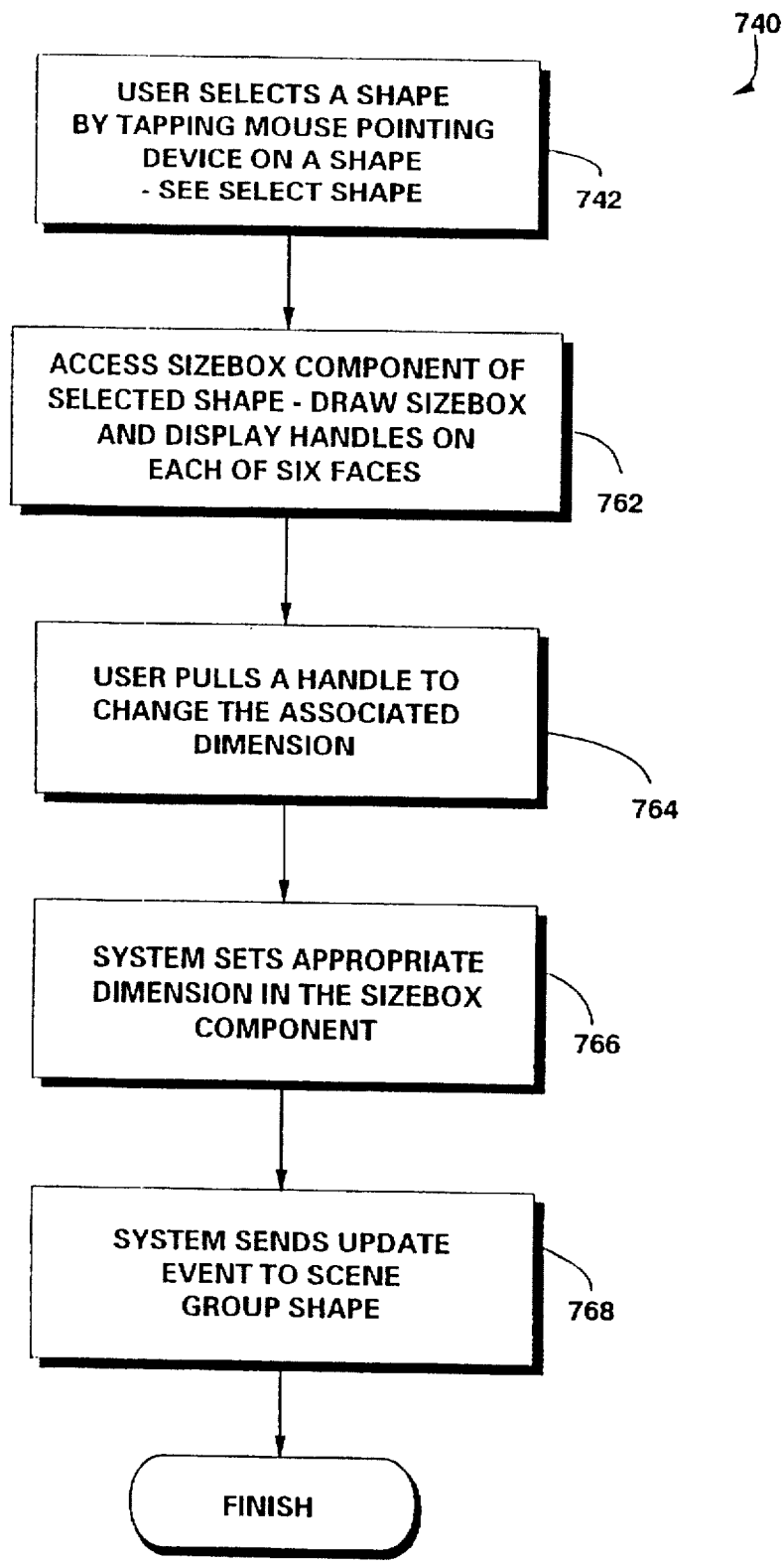

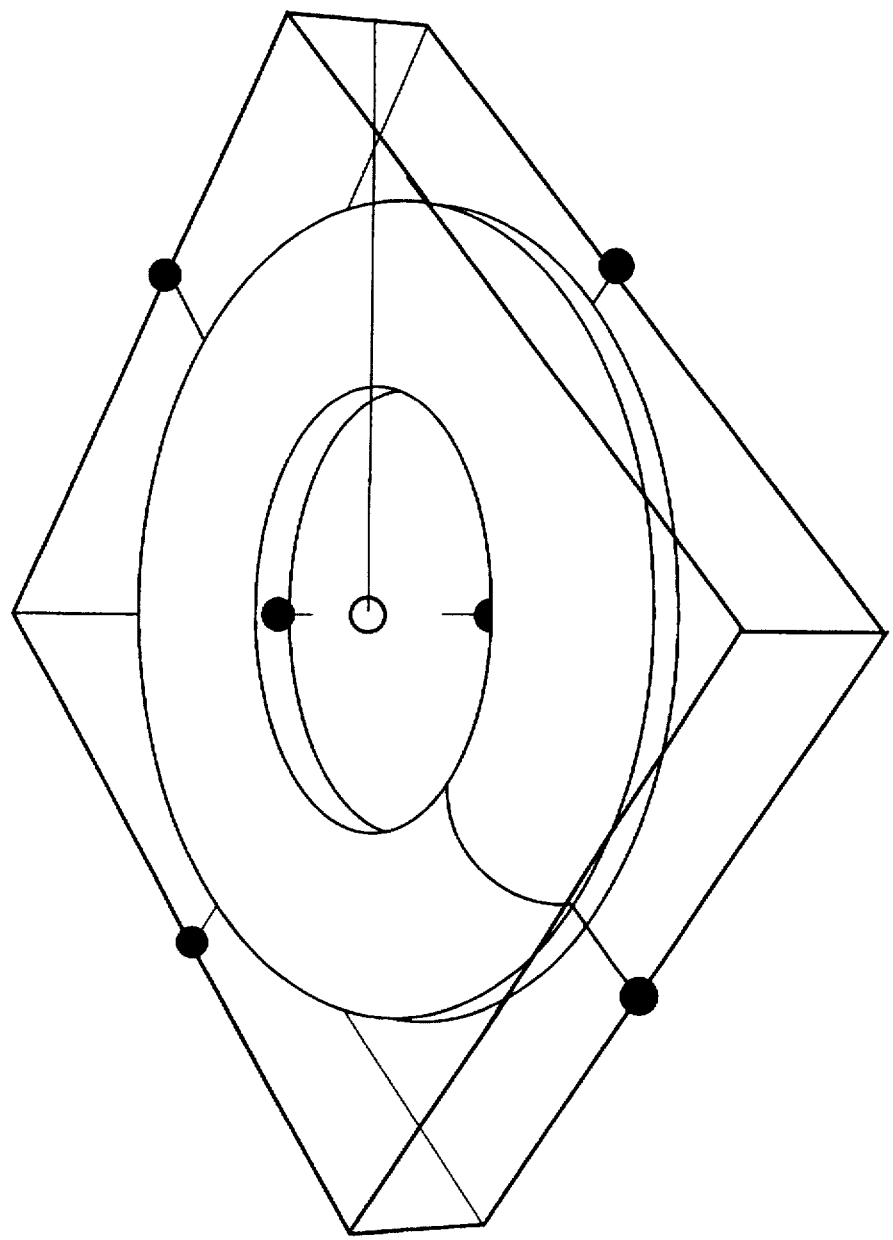
Fig. 22A EXAMPLE SIZEBOX DISPLAY

SELECT SHAPE

HIT TEST GROUP SHAPE

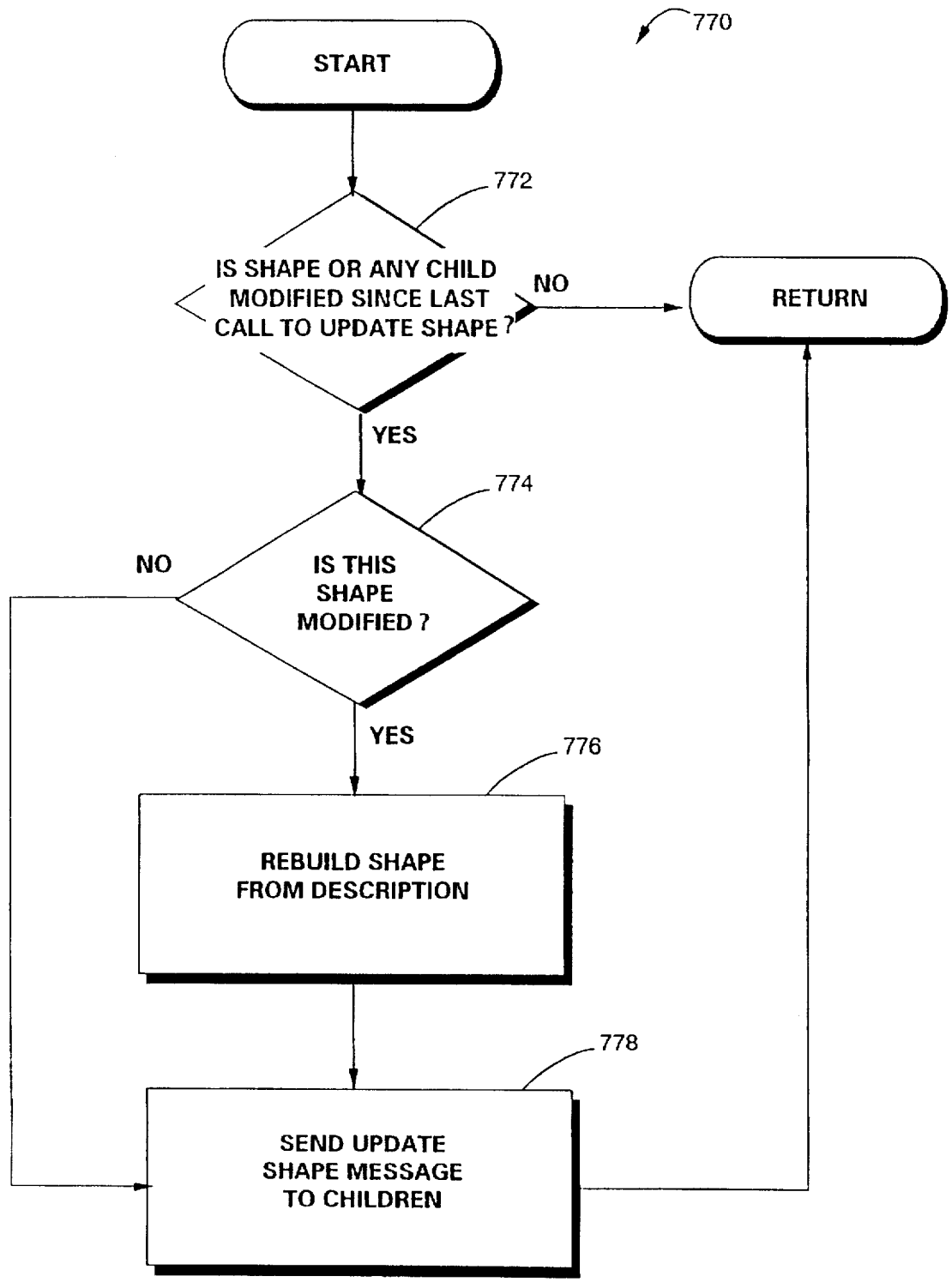
*Fig. 26* UPDATE SHAPE

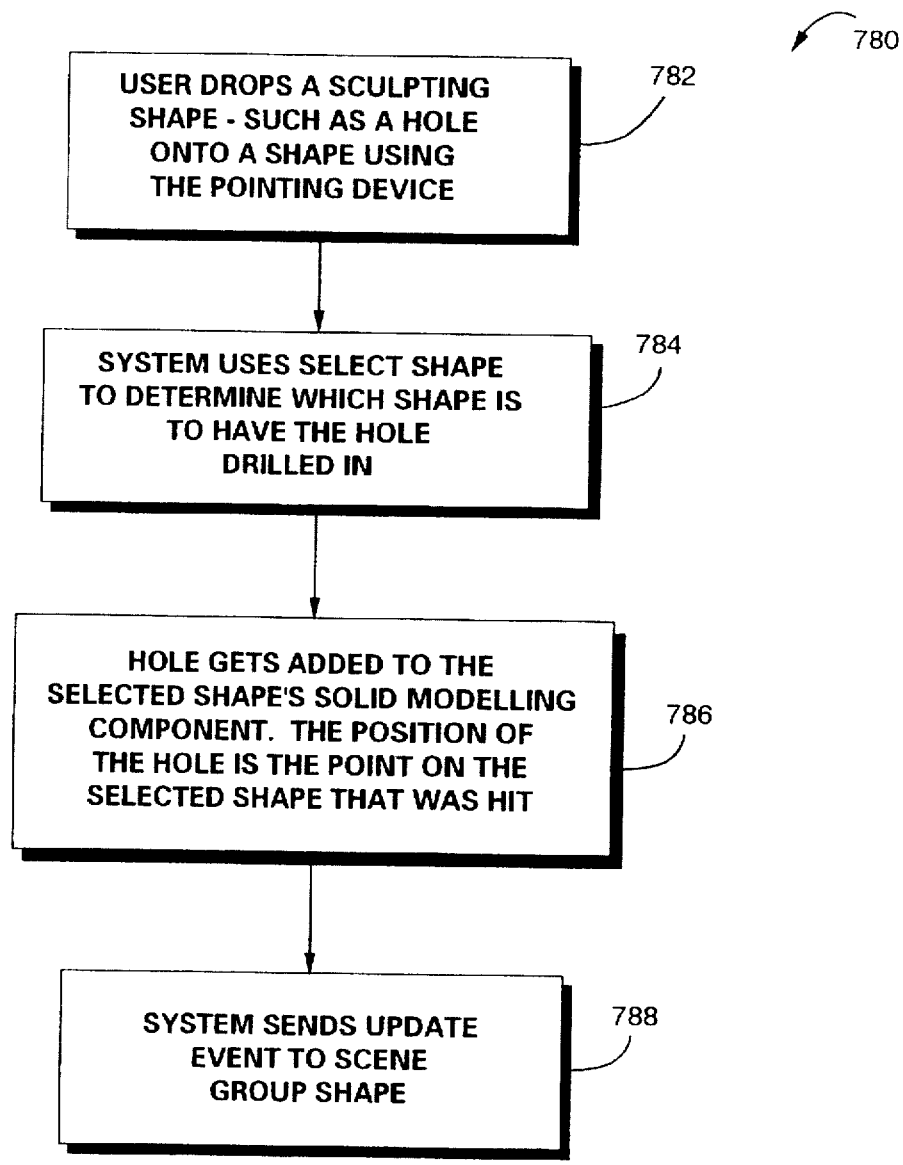
Fig. 27 BASIC FLOW - SCULPTING A SHAPE

INTELLIGENT SHAPES FOR AUTHORING THREE-DIMENSIONAL MODELS

FIELD OF THE INVENTION

This invention relates to 3-D computer graphics and solid modeling techniques. Still more particularly, the invention relates to extensible, automatic techniques and architectures for providing "intelligent" representations of 3-D objects.

BACKGROUND AND SUMMARY OF THE INVENTION

Images and pictures affect all of us every day in ways large and small. Pictures can have incredible impact, prompting people to buy a product, dress in a certain way, do or not do certain things, laugh or cry, and sometimes change their lives in radical ways. Some pictures are truly unforgettable.

The pictures hanging in art museums are one example of how images can be used to express complex, artistic ideas. However, because of their effectiveness, pictures and images are useful to communicate all sorts of complicated ideas and concepts. For example, a chart or an animation may allow someone to visualize and understand complicated concepts and relationships that only experts can otherwise grasp.

Images are also a very efficient way of conveying ideas. A picture is often worth at least a thousand words. This is why, for example, machinists work from blueprints rather than oral descriptions. Without a detailed blueprint, a machinist might construct a part very different from the one the design engineer has in mind.

Because of the importance of images and pictures in communicating ideas, human history has been filled with attempts to improve drawing tools and techniques. For example, centuries have been devoted to improving the colors and qualities of inks and paints. The invention of the lead pencil was a major improvement in drawing tools. But, no prior drawing tool compares in versatility and power to modern computer graphics.

Computer graphics (techniques for using computers to create images) have revolutionized images and pictures. It is now possible to create, with a computer, images so real that they appear to be photographs of actual real world scenes. Hollywood uses computer-generated special effects to produce realistic film sequences of space travel, dinosaurs, monsters, and other miraculous images. On a more mundane level, a graphic arts designer creating a corporate logo or a draftsman creating blueprints of a new car part may often nowadays use a computer instead of pencil and paper.

The world of computer graphics is divided into two fundamentally different types of computer graphics systems: two-dimensional (2-D) and three-dimensional (3-D). 2-D and 3-D systems each produce images on the flat, two-dimensional surface of a computer display or other imaging device. However, 2-D and 3-D systems are fundamentally different in the way they represent and process images.

A 2-D system can be analogized to a bulletin board. Each object has height, width, and up/down and left/right positions in a flat 2-D plane. The 2-D representation of an object is thus analogous to a flat image fragment like cardboard cut-outs a class of first graders might use to create a bulletin board display. 2-D computer graphics are very useful for drawing certain types of images (e.g., flat views of parts to be manufactured, blueprints and the like), but suffer from lack of realism and flexibility. Because each 2-D object has only height and width, it is difficult for 2-D computer graphics techniques to show realistic scenes from a variety of different viewpoints. Additionally, since lighting and reflection are essentially 3-D phenomena, it is very difficult to provide realistic lighting of a scene represented in 2-D. Furthermore, interactions between objects in a 2-D world are constrained and often not realistic.

In contrast, a 3-D computer graphics system represents each object in a scene in three dimensions. In a 3-D representation, each object has a height, a width and a depth—and a 3-D position within a 3-D "universe." The computer must do more processing and perform more complex calculations because it must keep track of three dimensions instead of two—but much more realistic images can result. Using 3-D computer graphics, the computer can show what an object looks like from any arbitrary viewing angle. For example, a 3-D computer model of an airplane might permit the computer operator to do a virtual "walk around" of the airplane, seeing it from the left side, the right side, the top, the front, the back, underneath—and even inside it. 3-D graphics also allow more realistic lighting effects to accommodate different directions and types of lights. Even more significantly, 3-D computer graphics can handle interactions between objects in much more sophisticated and realistic ways. Since a 3-D system keeps track of depth as well as height and width, it can allow one object to pass through another object so that it is partially within and partially outside of the object (e.g., a dart sticking out of a dart board; a bird that is behind, in front of, or partially within and partially outside of a tree; or a pipe fitting the end of which has been inserted into the flange of another part).

FIGS. 1A-1E show examples of images produced by a 3-D computer graphics embodiment in accordance with this invention. The FIG. 1A blueprint and associated part shows the contrast between 2-D (the background) and 3-D (a 3-D model of the part) with realistic shadowing and lighting. The parlor scene of FIG. 1B has realistic depth, lighting and shadowing not generally possible using a 2-D system. The FIG. 1C collage shows how a computer can create a realistic looking 3-D scene that couldn't exist in the real world. The FIG. 1D illustration of flowers shows how joinings between objects can be rendered realistically using a 3-D system. The FIG. 1E "landscape" of a game of jacks shows realistic shadowing and depth.

Ease of use has always been a significant problem in computer graphics. Many early computer graphics systems could be operated only by skilled computer programmers who understood—and could write in—the particular language the computer understands. In such early systems, a computer programmer would define an image by specifying a series of commands directing the computer to draw each image within a scene. A problem with this approach was that it was very time consuming and could only be done by an expert.

Much work has been done since then to make computer graphics easier to use. For example, the "mouse" pointing device was developed in the early 1980s as a way to allow a computer user to manipulate images on a display screen without having to key in commands using a keyboard. Additionally, advances in graphical user interface (GUI) technology made such systems more accessible to users other than skilled computer programmers. Although such advances in user friendliness have made computer graphics more accessible, even recent computer graphics systems and software capable of providing realistic images are generally difficult to use and require a high degree of skill to successfully operate to produce realistic images.

The ways in which the computer represents 3-D objects has a direct impact on many aspects of a computer graphics system—including how easy or difficult it is to use the system. CAD systems in the past have modeled solids with constructive solid geometry ("CSG") trees, hierarchical assembly structures and with some instancing. But further improvements are still needed and desirable.

This invention provides techniques for enhancing, expanding and extending prior computer graphics 3-D object representations, and to provide enhanced efficient use and processing of the representations. These improvements make it easier to use the computer graphics system and have other benefits as well.

In accordance with one aspect provided by this invention, shapes and solids ("shapes") modeled by a 3-D computer graphics system are provided with "intelligence." The shape typically includes geometric information (e.g., size and positional information), but may also include a wide variety of additional parameters—some of which may have nothing to do with the shape's geometry or display characteristics. For example, some intelligent shapes may include parameters specifying how the shape is to interact with other shapes—allowing the 3-D shapes to be manipulated more intuitively using a graphical user interface providing "drag and drop" capabilities. As one specific example, an intelligent shape may "know" how to land and slide over other shapes, how to snap into place and interlock with other shapes, how to maintain certain distances from other shapes, that a shape should slide on a surface or a certain distance away from a surface. In architectural drawing, for example, an intelligent shape modeling a chair could specify that the same scene must include a matching chair; that the chair should be spaced a minimum distance from a wall; that when the chair is graphically manipulated, it is to slide along the floor while maintaining contact with the floor; and that if purchased, the (corresponding real life) chair will take eight to twelve weeks for delivery.

This ability to specify the ways in which a shape interacts with other shapes provides great advantages in terms of ease of use. Using the model of a chair as an example, a user can use a mouse or other pointing device and an associated graphical interface to "drag" the chair from one place to another within a model room. Meanwhile, the chair "knows" that it is always to remain in contact with the floor and to stay in a particular orientation relative to the room (i.e., so it never floats above the floor and never tips over). This additional "intelligent" control reduces the number of factors the user must worry about, saves a lot of time and user frustration, and allows even non-technical, unskilled users to rapidly and efficiently create impressive images.

The present invention thus provides shape representations and associated architectures that allow shape properties to be operatively interconnected to behave "intelligently" in response to user interaction or other external events. The connections and relationships between the shape properties (data) allow the shapes to have their own unique response appropriate to the shape itself. For example, lengthening an intelligent shape representing a staircase may cause more treads to appear—rather than widening each tread to some unnatural, impractical width. A cube shape can know that if any dimension is changed, all dimensions must be changed so it remains a cube. A dart shape can know that it is to attach itself to another surface at its point and that its point is to penetrate a certain distance into that other surface.

The "intelligent" shapes may also provide multiple representations of the same 3-D object. For example, the "complete" representation of a shape or object may include a variety of information for a variety of different purposes. One representation (precise surfaces) may only be needed by manufacturing engineers. Some of the characteristics (e.g., position, color, texture, approximate "facet" form, etc.) relating to the geometry of the shape may be used for drawing an image. Some shapes can be used to intelligently modify the geometry of other shapes (e.g., a hole can be drilled into a shape, a block can be welded to another block, etc.) Other shape characteristics (e.g., minimum distance from the wall, a requirement to stay in contact with the floor, a requirement or capability to "snap in" and interlock with another shape automatically, etc.) may only be needed when the user is manipulating the shape to establish its new position in the scene. Still other shape properties (e.g., whether it is hard or soft, whether it bounces or breaks, whether it pulls or attracts another shape to it (undeformed or by deforming the other shape) as it comes close to it, etc.) may relate to the dynamic behavior of the shape when the shape is used in an animation or the like. Still other shape properties (e.g., it will take 8 to 12 weeks to order a chair) may be needed only when the item represented by the shape is purchased electronically or otherwise. Access to various levels of representations can be limited depending on privileges granted to content users (for example, a buyer of a GE refrigerator doesn't care about the details of the motor, he or she just wants to know its power and possibly its specs if he ever needs to replace it).

A component-based architecture provided in accordance with this invention may be used to expose any of multiple, alternate representations of the same shape depending on the particular need or application. The ability of intelligent shapes to be represented by a wide variety of different types of information without degrading the efficiency in which the representations can be accessed and manipulated for different purposes is very powerful in providing optimal performance and flexibility. Multiple representations of a shape can also be used to provide an "intelligent load" that loads only those components necessary for a particular task. For example, if the shape is being accessed only by reference through another shape, only those components and associated data pertaining to the specific reference (e.g., certain geometrical characteristics) may need to be accessed. A user merely interested in generating an image of a predefined scene may only need to access and load those shape components required for imaging. Un-needed components need not be loaded or even read. This multiple representation and intelligent load feature is especially powerful and advantageous in remote interactive imaging applications (e.g., via the Internet) where data transfer and/or load times must be minimized.

Various different shape properties may be maintained in (or through) individual independent "components" that interface with a general purpose shape bus. Additionally, a component-based representation substantially simplifies the complexity of the overall environment and provides great flexibility by permitting the shape representation to be freely extended on an as-needed basis. In accordance with one specific aspect provided by the present invention, the components may "plug into" the bus using a generic interface or "socket" configuration—permitting use of a wide variety of different component types that can change from one application to the next. These components may include (and/or reference) data as well as executable code, and may respond to messages or "events" on the bus. The components may also broadcast or send messages to other components (or other structures) via the bus.

Components need only respond to bus messages that concern them. This ability of different components within the representation to react or respond to (only) events that concern them provides enhanced flexibility and efficiency. For example, components defining dynamic behavior may ignore messages pertaining to the generation of static images. For example, only a surface texture component (and no others) may need to respond to a message that the user has selected a different surface texture for the shape.

In accordance with another aspect provided by the present invention, different components may be independent of one another so they can each be used with or without other components. While most shapes will typically have at least basic geometry components (e.g., size and position), even these components may be independent of one another and of any other components that may be used. Component independence facilitates multiple representations and also enhances the modular nature of the representation.

In accordance with yet another feature, the components in the component-based architecture provided by this invention are stored and maintained separately from at least some data to which they refer. Thus, the representation of a shape may be stored in two parts: a content file defining the various components, and a data file storing the data for each of the defined components. This storage arrangement enhances the ability of multiple shapes to efficiently reference one another without introducing processing inefficiencies. For example, multiple instances of the same generic shape (e.g., the four wheels of a car) may have essentially identical components but differ in the positional (and possibly other) data to which the components refer. This technique also facilitates one shape efficiently referencing another shape (e.g., increasing the size of a car wheel also increases the size of the hubcap). The reusability of shapes, components and data facilitated by this approach provides for a more compact representation and provides further increases in efficiency.

In accordance with yet another feature provided by this invention, an optional, precise geometry component may be provided as part of a shape's representation. Graphics arts designers typically have no need for or interest in the precise dimensions of a 3-D model—but such precise dimensions may be absolutely critical to a machine part designer. Precise geometry components need not be accessed for normal "imaging" on a display, but may be used to provide additional precision (e.g., for automatically rendering the solid model in blueprint form). In one specific example, the user can control whether or not a precise geometry component is maintained. In another example, there can be different versions of a computer graphics system—some that support precise geometry capabilities and some that don't.

By way of summary and still further explanation, the present invention provides the following example advantageous features:

A shape modeled in accordance with the present invention provides a simple, open, efficient, customizable, hierarchical, dynamic, and extensible object that may be used to define a 3-D object.

Intuitive intelligent shape 3-D drawing capabilities.

Simply drag and drop intelligent 3-D shapes that know how to land and slide over each other.

The programmed intelligence of shapes lets them respond to changes and interact with other shapes in logical, even thoughtful ways. Shapes routinely slide around and blend into each other without special cues from the user.

The intelligent shapes "know" about each other; if the user drags a box onto a slab, the two shapes can orient themselves similarly in 3-D space and automatically group into a model.

The shapes contain attachment points which know how to glue to each other.

Shape representation includes information beyond geometry.

Multiple representations of the same 3-D object.

Multiple representation may include image (e.g., facet, curve, surface finish, text), physical (e.g., extrude, turn, sweep, loft, history), functional (e.g., anchor, precise dimensions, variable), and behavioral (e.g., static and dynamic).

Properties can specify dynamic behavior (e.g., how to snap objects together, animation behavior, etc.)

Capable of precise representation for manufacturing purposes.

Hierarchical representation.

Advanced intelligent shape properties include blending, chamfering, tapering, shelling and capping.

Intelligent shapes align, move, size, rotate, and tilt easily using a "snap in" capability that snaps them to tangencies, midpoints, edges and attachment points.

Possible to have behavior components defining characteristics such as, for example, motion properties for acceleration and gravity.

Multiple instances for reusability.

Simple numeric entry for size and position.

Multiple levels of editing expose different shape characteristics to provide ease of use.

Representation is extensible.

Properties establish relationships between objects.

Independent components.

Components may be defined by a set of named data fields; expressions can relate fields together.

Hierarchical group component defined structure.

Components are dynamic; they can be added and/or removed at run time in response to user requests.

Component types can be added at any time.

Components can be shared between shapes (instancing).

Event driven—component functionality such as draw triggered by signals from an event bus.

A bus provides conflict resolution as well as broadcast send and receive capabilities.

Intelligent loading.

Intelligent shapes are fully customizable by the user.

In one example, any OLE automation scripting language can completely define a shape.

3-D body and facet data can be compiled from simple definitions and optionally saved.

BRIEF DESCRIPTION OF THE DRAWINGS

These and other features and advantages provided by the present invention will be better and more completely understood by referring to the following detailed description of example embodiments in conjunction with the drawings, of which:

FIG. 2 shows an overall example computer graphics workstation provided in accordance with an example embodiment of this invention;

FIG. 2B shows a network example;

FIG. 3 shows an example constructive solid geometry tree;

FIG. 5 shows how the FIG. 4 shape representation can be extended to provide a group shape;

FIG. 5A shows an example user tool for customizing a component;

FIG. 6 shows reuse of the same example shape definition to provide multiple instances;

FIG. 7 is a diagram of an example shape data structure;

FIG. 9 is a diagram of an example component type table;

FIG. 10 is a diagram of an example variable context data structure;

FIG. 10A shows an example variable context data structure for an anchor component;

FIG. 10B shows an example diagram of the relationship between a shape's size box and an anchor;

FIG. 11 shows an overall representation of intelligent shape storage;

FIG. 12 shows a more detailed example shape content file data structure;

FIG. 18A shows a more detailed example load shape process;

FIG. 21 shows an example process for drawing a shape;

FIG. 22 shows an example process for modifying a shape;

FIG. 22A shows an example size box display;

FIG. 26 shows an example process for updating a shape; and

FIG. 27 shows an example process for allowing a user to sculpt a shape.

DETAILED DESCRIPTION OF PREFERRED EXAMPLE EMBODIMENT(s)

Overall System

Figure 1A:
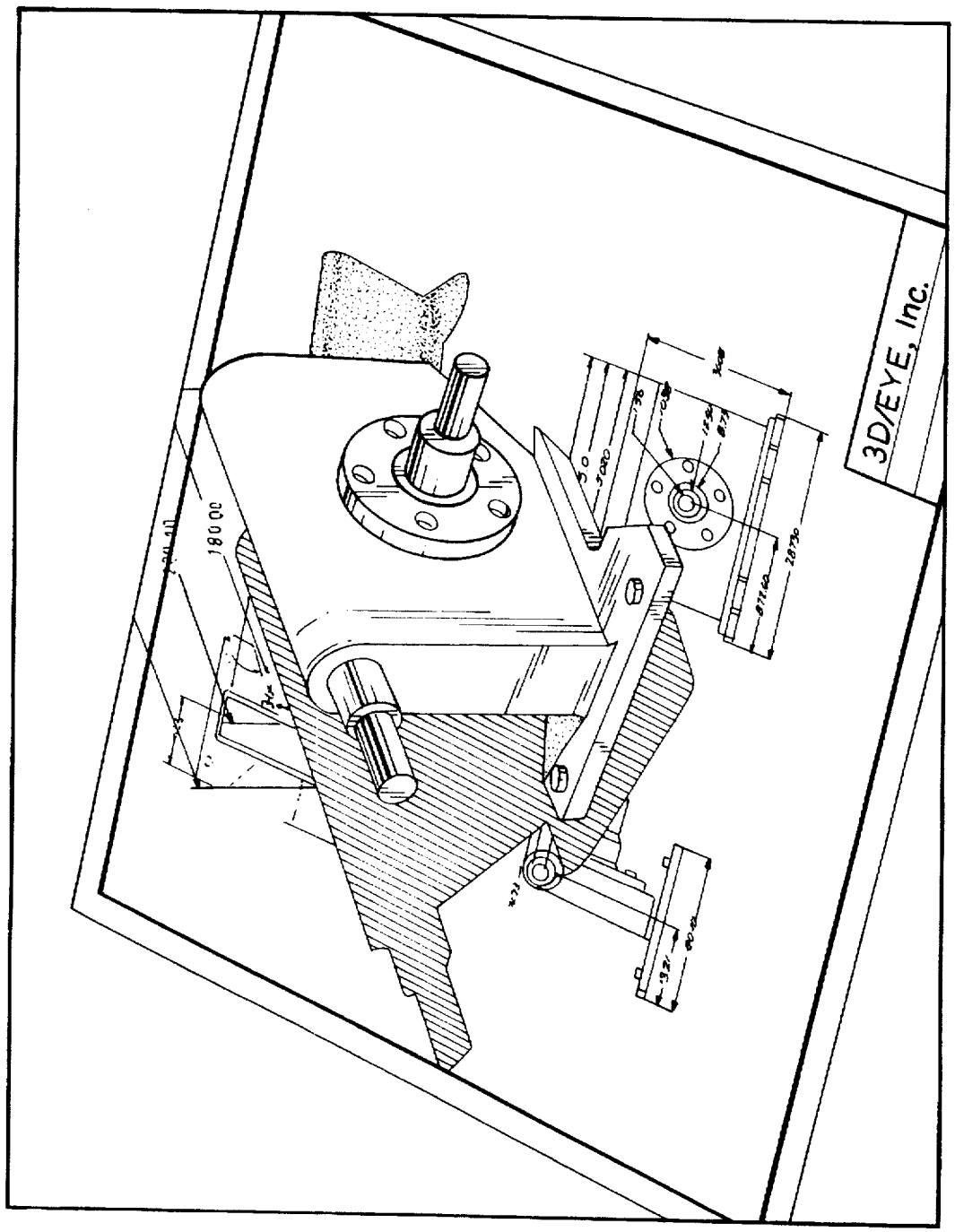
FIGS. 1A–1E show examples of images produced using an example 3-D graphics system provided in accordance with the present invention.
Figure 1B:
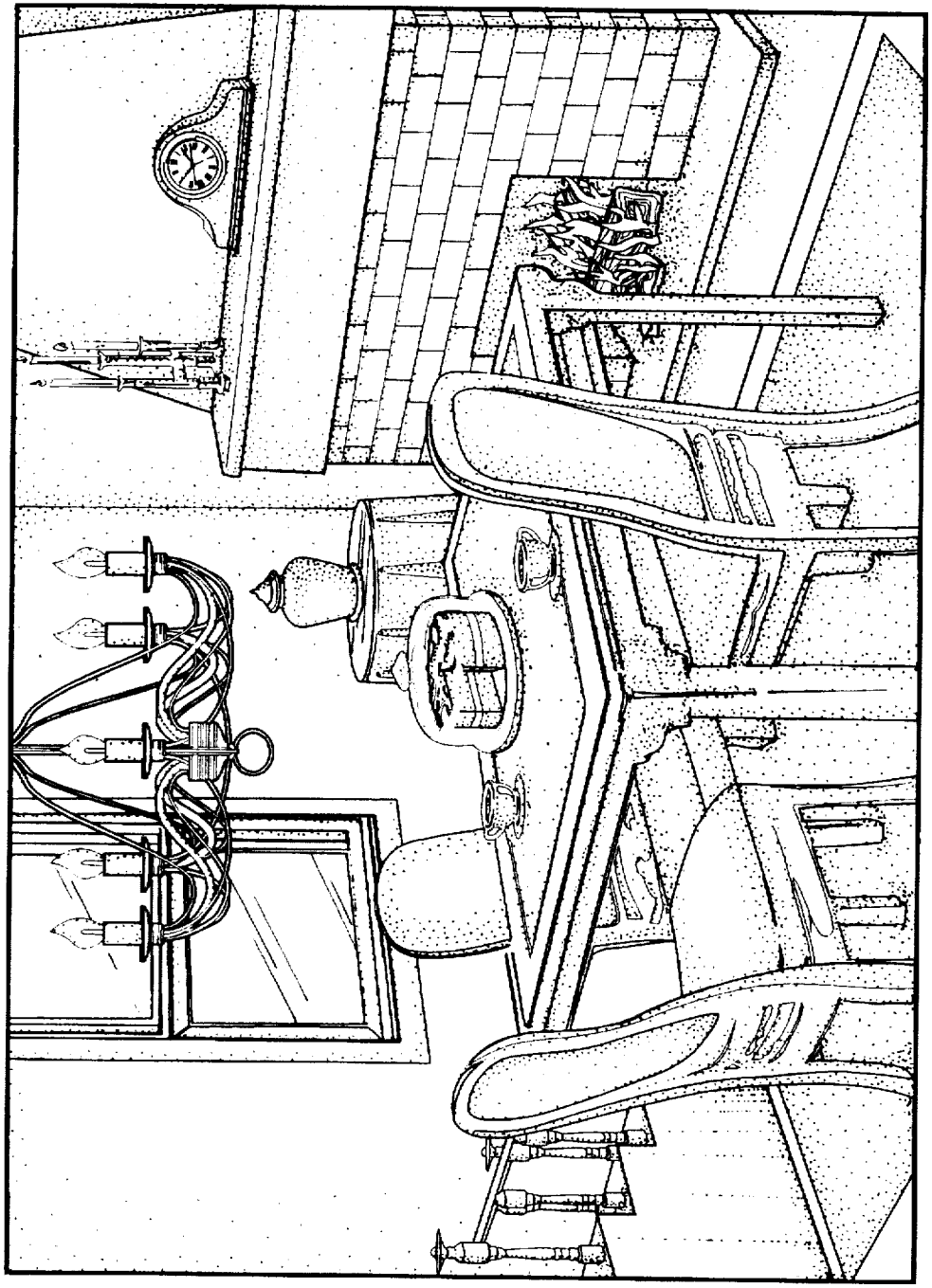
Figure 1C:
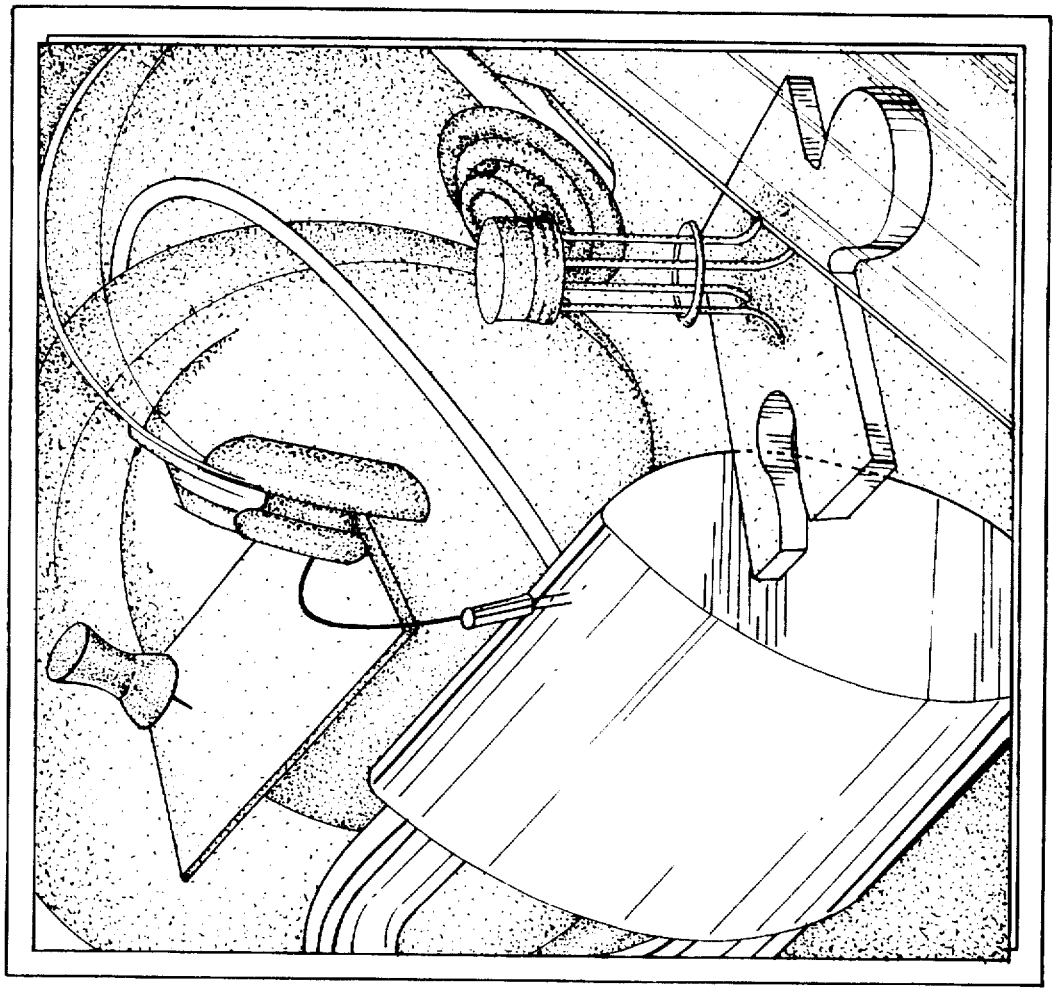
Figure 1D:
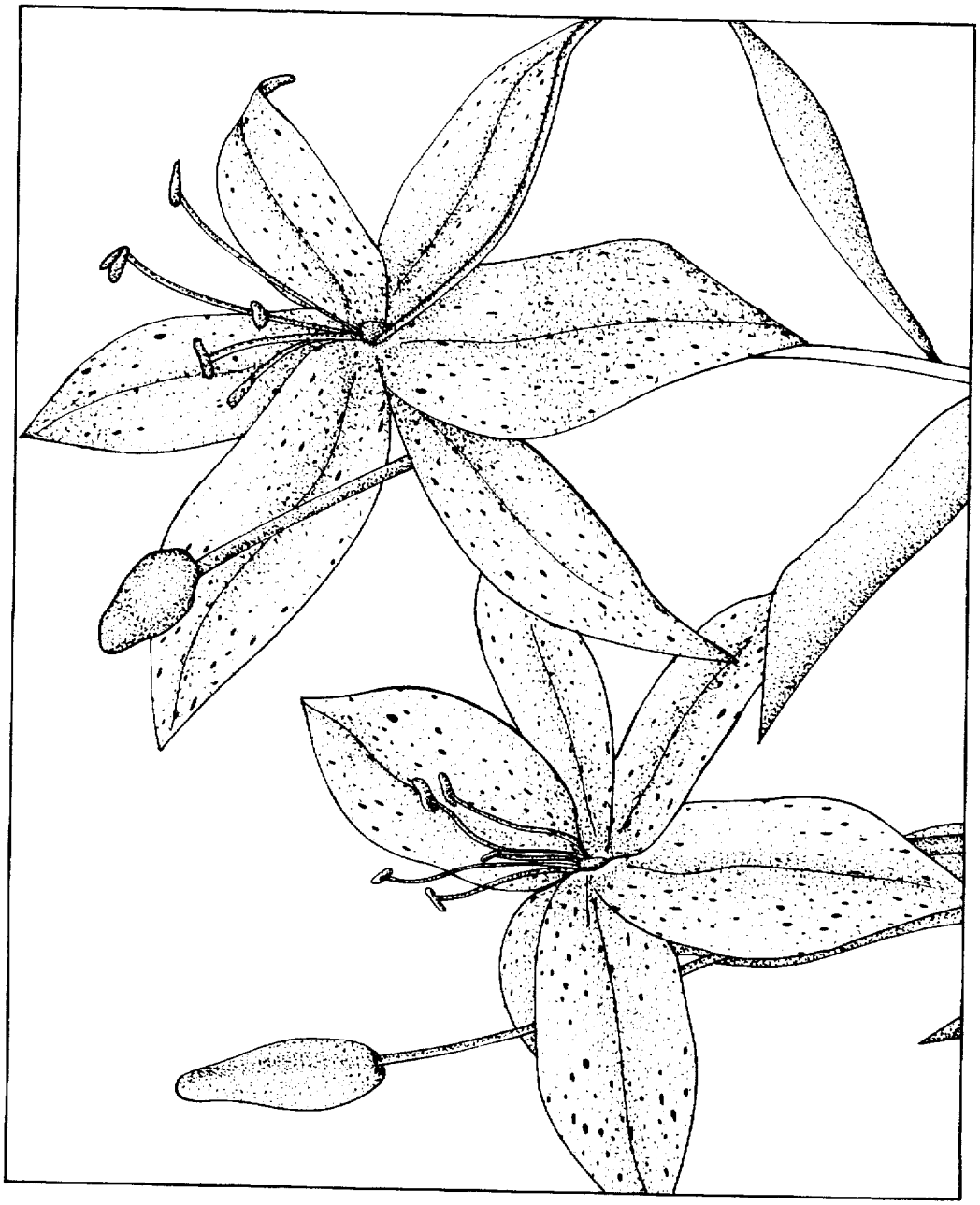
Figure 1E:
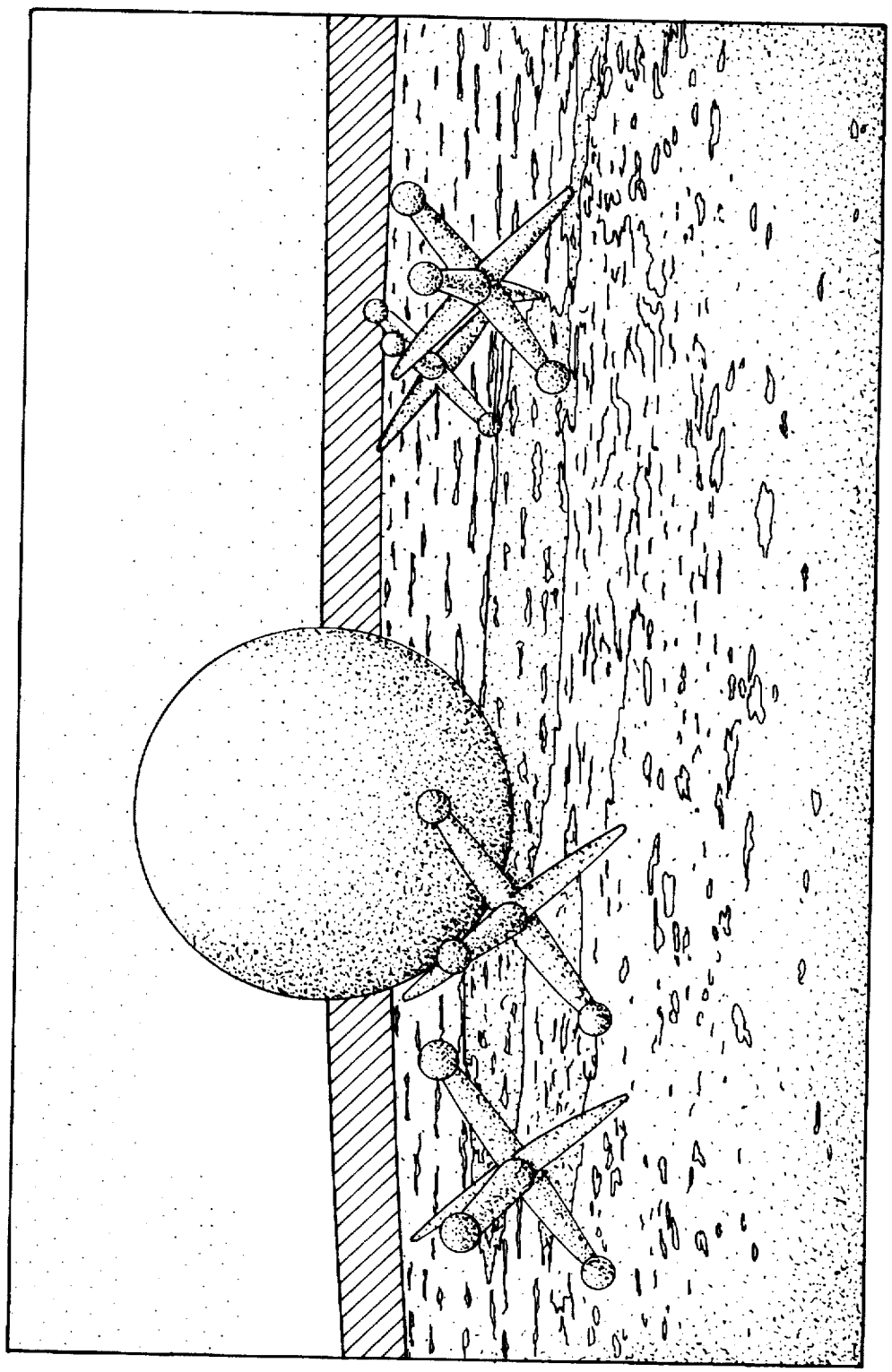

FIG. 2 shows an example computer graphics workstation 150 provided in accordance with a presently preferred example of this invention. Workstation 150 includes a general purpose computer 152, a keyboard 154, a mouse pointing device 156, a display 158, and a printer/plotter 160. Computer 152 may be, for example, a conventional microcomputer such as an IBM compatible personal computer including a microprocessor 162, random access memory 164, read only memory 166, a graphics video adapter 168, a mass storage device such as a magnetic disk 170, and an optical and/or floppy diskette drive 172. Computer 152 displays images on display 158 (and/or prints the images on printer/plotter 160) in response to user inputs via keyboard 154 and/or mouse pointing device 156. The computer 152 creates images such as the 3-D logo shown are created based on steps it performs under control of a computer program stored on mass storage device 170 and/or another storage media (e.g., an optical or magnetic disk, not shown) provided via drive 172. A communications connection 174 between computer 152 and a network 176 (e.g., the Internet) may be provided to allow the user to access information from the network and/or exchange information with another computer also connected to the network.

Figure 2A:
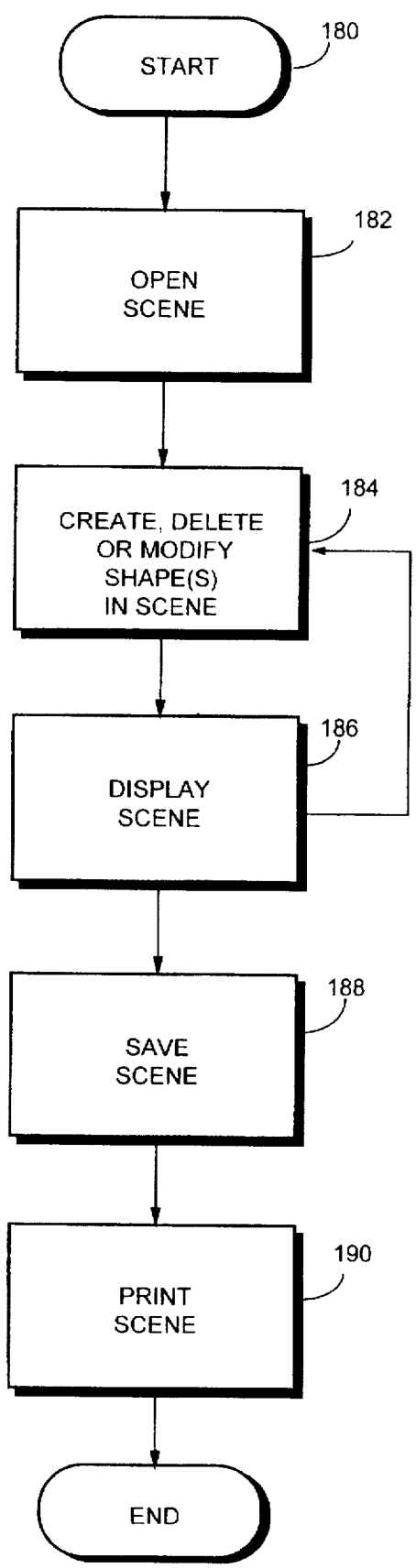
FIG. 2A is a flowchart of example program controlled steps performed by the FIG. 2 workstation.

FIG. 2A shows example steps a user might follow to create the example 3-D logo shown in FIG. 2. The user may start up computer 152 and cause it to load the computer graphics software from mass storage device 170 into random access memory 164 for execution by microprocessor 162 (block 180). The user may then open a "scene" (i.e., a visual landscape) (block 182). The "scene" may be blank, or it may have been previously defined to contain certain shapes. The user may then create and/or modify one or more 3-D solid modeling shapes within the scene (block 184) and cause the modified scene to be displayed on computer display 158 (block 186). Because workstation 150 provides 3-D graphics capabilities, the user can change the viewpoint of the scene, change its lighting, or otherwise modify the scene—and the workstation will redraw the scene automatically (block 186). The user may save the scene on mass storage device 170 (block 188), and may optionally print the scene using printer/plotter 160 (block 190).

Network Example

FIG. 2B shows a network example usage of this invention. In the FIG. 2B example, an intelligent shape server 192 is connected to any number of remote workstations 150(1), 150(2), ... 150(N) via a network 176 such as the Internet. Server 192 provides a software-driven shape database engine ("DB") that maintains a database of intelligent shapes for access by workstations 150 over network 176 (and may include tools for adding shapes to the database and to query shapes already stored on the database). Each workstation 150 may be equipped with an Internet client ("CL", also in software) for interacting with intelligent shapes. This Internet client is preferably compatible with existing Internet access software such as Netscape and Microsoft web servers. The workstations 150 access server 192 over the Internet, and their Internet clients provide storage and display capabilities (preferably in both Virtual Reality Modeling Language (VRML) representations and in the intelligent shape representation described herein).

In this example, server 192 provides a collaborative environment where users can publish, link and browse 3D objects. Remote users can interact with a 3D world maintained by server 192, and can add 3D objects to the world, delete objects from the world, change objects in the world, and move objects around in the world. Server 192 may, for example, allow one engineer working from remote workstation 150(1) to manipulate a 3D scene maintained at the server to drop in a new engine mount into an automobile model; enable a second engineer working from remote workstation 150(2) seeing this to drop in an engine to check for fit and clearance; and then allow the first engineer to make engine mount modifications as needed. Similarly, an architect working from remote workstation 150(3) could use her Internet client to create a 3D floor plan on server 192, and allow the architect's (human) client to rearrange the floor plan from a further remote workstation 150(4)—all by using intuitive, drag-and-drop techniques. As a still further example, server 192 might maintain a shopping catalog filled with 3D shapes. A user accessing the server 192 over Internet 176 can select objects to find out their price and availability, and then order them "on line." As a still further example, server 192 might provide an "ultimate" 3D web site providing games, products, supplier connections, etc. Other example applications include product advertising, "pay as you go" usage, object rental (e.g., rent a warrior or a dinosaur), enterprise links within organizations, etc.

As will be explained further below, the flexibility and power of the 3D object representations and associated processes provided by the present invention allow such coordination to be done efficiently and effectively over Internet 176 while minimizing the amount of data that needs to be transferred (for example, server 192 can deliver information about a 3D world incrementally on an as-needed basis in order to fit user needs).

Intelligent Shape Representation

To represent shapes, workstation 150 may use an extension of a well known hierarchical "constructed solid geometry" ("CSG") technique for representing 3-D solids. CSG builds more complicated objects from simpler objects known as "primitives." The simpler objects can be combined using various operations (e.g., Boolean operators such as and, or, not, etc.). The computer stores the overall object as a tree, each of the "leaves" of the tree comprising a primitive object.

FIG. 3 is an example CSG tree provided by this invention. In this example, a complex machine part 100 is formed by the union of two less complicated parts: a pipe portion 102 having a hollowed out end 103; and a slab 104 having a bevel 105. The pipe portion 103, in turn, is formed from a cylinder 106 combined using a subtraction ("not") function with a smaller diameter disk portion 107. Similarly, bevel slab 104 is formed from a rectangular slab 108 from which a volume defined by a parallel piped 109 oriented at an angle has been removed. Arbitrarily complex objects can be modeled from more basic objects using the CSG technique shown in FIG. 3.

One characteristic of the CSG representation is that each time a new image is to be generated, the entire CSG tree must be traversed to reassemble each object from its more primitive or basic components. Despite this inefficiency, the CSG representation is very flexible in terms of expandability and compactness. Additionally, users can efficiently edit the CSG representation by modifying or replacing subtrees or individual leaf nodes is desired.

Unlike prior art CSG trees, the FIG. 3 CSG tree provided in accordance with this invention includes intelligent properties associated with objects represented by the tree. These intelligent properties may provide any or all of a variety of different types of information. For example, the intelligent properties 107A associated with disk 107 might, if desired, cause the disk to "snap onto" the end of cylinder 106A whenever the disk is "dragged" (using a graphical interface) into proximity with the cylinder. The intelligent properties 102A associated with object 102A might, for example, define the center of bevel 105 as being an "anchor," and still other intelligent properties 100A of object 100 may define the price and availability of the finished machine part.

Figure 3A:
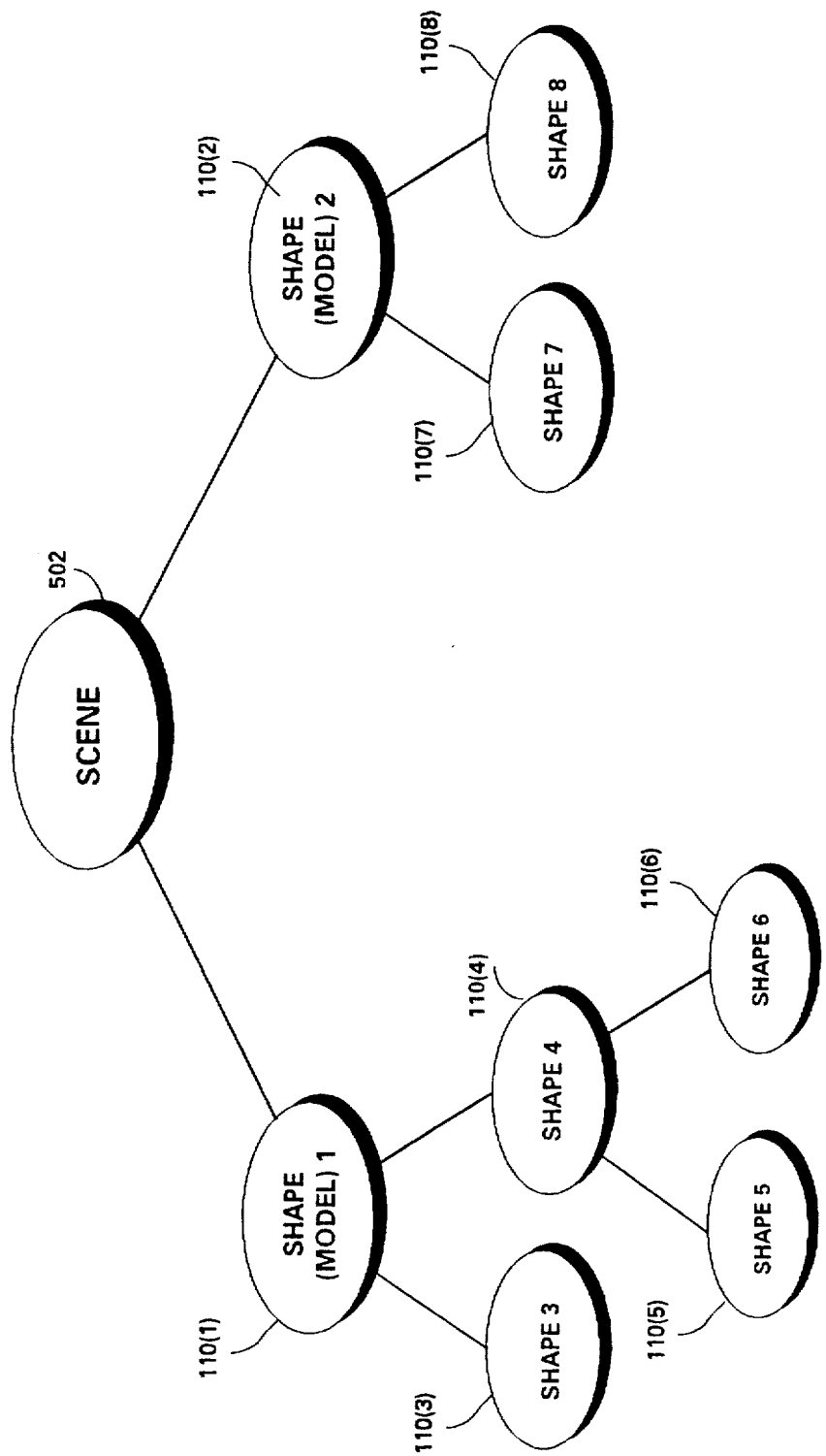
FIG. 3A shows an example hierarchical representation of a group shape.

FIG. 3A shows another view of a hierarchical depiction of a shape. In the FIG. 3A diagram, an overall "scene" 502 (which may itself be considered a shape) has one or more "child" shapes 110(1), 110(2). These higher level shapes may, in turn, be constructed of further shapes. For example, shape 110(1) may be built from child shapes 110(3), 110(4)—and these child shapes can be built from still additional shapes (e.g., shape 110(4) might be built from child shapes 110(5) and 110(6)). Shapes built from other shapes may be called "model" or "group" shapes. Thus, in the FIG. 3A example, shapes 110(1), 110(2), and 110(4) are all "group" shapes because they are constructed from one or more other shapes.

In accordance with one aspect of this invention, each of shapes 110 has a common software structure and design. This common design provides a high degree of modularity and also facilitates reusability.

More Detailed Component-Based Intelligent Shape Representation

Figure 4:
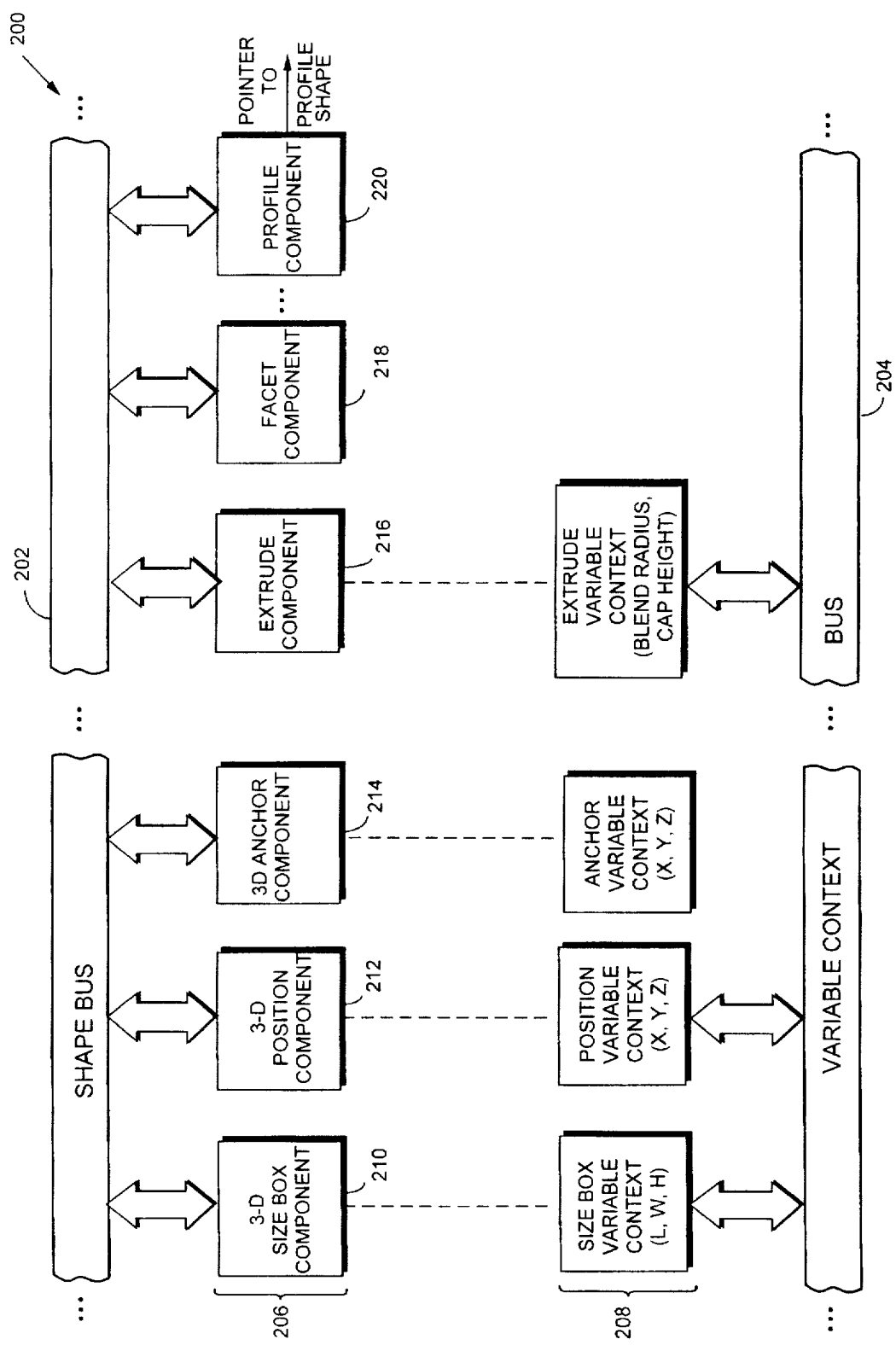
FIG. 4 shows an overall representation of an example intelligent shape structure.

FIG. 4 shows a more detailed example architecture of a "shape" 200 (i.e., any one of the FIG. 3 objects) provided by the present invention. Shape 200 includes a shape bus 202, a variable context bus 204, one or more shape components 206 coupled to the shape bus, and one or more variable context blocks 208 coupled to the variable context bus. Shape 200 can be viewed as an empty container providing a simple plug interface (shape bus 202) that can accept any number of different shape components 206. Since shape bus 202 is infinitely extensible and provides a simple, generic interface, any number and/or type of shape components 206 may be provided.

In this example, each shape component 206 is independent of all other shape components (i.e., each shape component is entirely self-contained—although shape components may and typically do refer to corresponding variable context blocks 208).

In the particular example shown in FIG. 4, shape 200 includes a 3-D size box component 210, a position component 212, an anchor component 214, an extrude component 216, a facet component 218, and a profile component 220. Most shapes 200 typically include a 3-D size box component (used to specify the size of the solid being modeled), a 3D anchor component (represents a 3D position, i.e., an "anchor", in the space of the shape), and a 3-D position component (which specifies the 3D position of the shape's anchor in its parent's space). Other shape components 216, 218, 220 are optional and may or may not be present (or alternatively, any number of other, different components may be substituted).

Different shape components 206 can be used for different functions or activities relating to shape 200. Some shape components 206, for example, relate to rendering images of the corresponding shape (in the particular example shown in FIG. 4, facet component 218 is an example of an image component). Other examples of image shape components 206 include curve components, surface finish components, text components, and texture components. Still other shape components 206 relate to the physical structure of the solid being modeled. Extrude component 216 shown in FIG. 4 is an example of a physical component (in the FIG. 4 example, profile component 220 points to a "profile shape" which defines the 2D curves used in the extrude operation provided by extrude component 216.). Other physical component examples include turn components, sweep components, loft components, and history components. Still other shape components 206 relate to functional requirements (e.g., the "anchor" component 214 shown in FIG. 4 is one example of a functional component; other examples include attachment point components, dimension components and variable components). Still other components 206 may relate to dynamic or static behavior of the shape 200, or any other imaginable shape characteristic (e.g., the price and availability of the object represented by the shape for use in a computer catalog, for example).

An additional component 206 may be an OLE object component comprising a shape component wrapper around an executable application such as a Microsoft Excel data space. In this example, a shape component 206 can be both a client and a server—so that an OLE application can both use and access data through a shape component, and allow the shape component to access data or other resources provided by the OLE application.

A non-exhaustive list of components include:

size box component (provides overall size of the shape);

group component (manages hierarchical structure of shapes);

path component (manages a connected collection of 2D curves);

path manager component (manages a collection of path components);

position component (defines position of anchor in parent space);

anchor component (defines position of the preferred attachment point relative to the shape's size box);

shape finish component (defines the overall color/texture for the shape's image);

light component (if this component exists, the shape is a light; this component controls color, cone angle and other properties of the light);

facet component (defines approximate 3D surface description of the shape);

reference geometry component (defines secondary attachment points, e.g., for attaching shapes together);

boundary representation component (provides a precise surface description of a shape);

edge blend component (controls blending and/or chamfering of a solid edge);

sweep component (defines geometry by sweeping a 2D profile along an arbitrary path; if the path is linear then this becomes an extrude component);

profile component (references the 2D shape used by the sweep component);

sweep path component (references the path used by a sweep component);

text component (defines geometry from a text block which includes font and size characteristics as well as an extrude distance);

triball component (defines center and orientation for a triball 3D shape rotating tool);

studio component (a special type of group component that keeps track of lighting and camera information);

history component (the group component with CSG operators);

user interface behavior component (defines actions to be taken on specific user interface events such as drag, drop and others);

OLE object component (defines geometry of a shape as an embedded OLE object);

face finish component (defines the color/texture for a specific surface of a shape);

loft component (defines geometry by lofting multiple profiles);

profile group component (defines the list of profile shapes used by the loft component);

dimension component (defines a distance or angle between two other shapes); and variable component (a scratch pad used to hold intermediate results).

Group Shapes

In an example shown in FIG. 5, a shape 200 can refer to one or more additional shapes to form a hierarchical or tree structure of the type shown in FIGS. 3 and 3A. Shapes in this hierarchy that refer to a given shape are conveniently termed "parent" shapes, while shapes that a given shape refers to are conveniently called "child" shapes. FIG. 5 shows how a shape 200 can refer to one or more child shapes 200(1), 200(2), . . . . The FIG. 5 shape 200 includes a size box component 210, a position component 212, an anchor component 214, and a group component 221. Group component 221 includes references (indicated by line 230) to one or more child shapes 200(1), 200(2), . . . . Each of child shapes 200(1), 200(2) . . . can have the same general structure as shown in FIG. 4 (i.e., each one has a shape bus 202, variable context bus 204, one or more shape components 206, and one or more variable context blocks 208 (not shown). Thus, a shape 200 can refer to any number of additional shapes 200(1), 200(2) . . . 200(N)—and in turn may be referred to by any number of shapes. Although the group shape 200 shown in FIG. 5 has only two child shapes, it could have any number of child shapes as desired. The group component 221 may include the combinational operation information discussed in connection with the FIG. 3 CSG tree to combine the child shape geometries, and may include a variety of other properties or characteristics as well.

Variable Context Blocks

In general, shape components 206 each include both data and executable code. However, to increase flexibility, example shape 200 includes modular variable context blocks 208 (see FIG. 4) that contain variable context data associated with and required by shape components 206. Providing each shape component 206 with its own variable context provides a more general representation and increases flexibility. In addition, making the variable context blocks 208 modular and connecting them to a separate variable context bus 204 provides additional advantages, such as, for example, making it easier for other shapes to refer to the variable context of a given shape, and allowing independent storage and loading of variable context data.

In this example, the variable blocks 208 may be viewed as distributed spreadsheets. They may contain numerical values (e.g., height=1.000000"), formulas or variables that refer to components of other shapes (e.g., value=Parent\Size Box\Length/4), or a combination of variables, variable expressions and fixed values. The variable expressions used within variable blocks 208 in this example are preferably "localizable" (i.e., they are natural language independent—permitting shape 200 to be used by speakers of many different natural languages, such as English, Japanese, etc.).

Tools are preferably provided to allow a user of graphics workstation 150 to specify and edit variable blocks 208 to customize shape 200. An example of such a tool to allow a user to customize the characteristics defined by a surface finish and/or other component as shown in FIG. 5A.

Shape Instancing

Shape instancing is a powerful feature provided by one aspect of this invention. On a simplistic level, shape instancing allows a shape to be reused over and over within the same model or scene. For example, if a car being modeled has four identical wheels, the same shape representing a wheel may be reused for each wheel. Each car wheel in the model is thus an instance of the same wheel shape definition. Advantages of this reusability include a more compact shape representation, and performance efficiencies due to a reduced amount of data that needs to be processed.

FIG. 6 shows that there are two kinds of shapes: definitional shapes and instance shapes. A definitional shape is not an instance of any other shape. The shape 130(1) shown in FIG. 6 is a definitional shape because it includes no components that are instances of the components of any other shape. Thus, definitional shape 130(1) includes and explicitly stores and maintains a size box component 210(1), an extrude component 216(1) and a facet component 218(i) in this example. Shapes 130(2) and 130(3) in this specific example are each instance shapes because they include components that are instances of the definitional shape 130(1) components. For example, instance shape 130(2) includes a instance size box 210(2) that is simply a reference to the definitional shape size box component 210(1)—and similarly includes a facet component 218(2) that is simply an instance or reference to the definitional shape facet component 218(1), and an extrude component 216(2) that is simply a reference to the definitional shape extrude component 216(1).

As maintained by the preferred example, these instance components are simply stored and maintained as references to the corresponding definitional components—providing full reusability, minimizing the storage requirements, and eliminating the need for an instance shape to maintain or update the components (the definitional shape that "owns" the components takes care of these processes).

Note that instance shapes can have a mixture of explicit (definition) components and instance components. Thus, in this example, each of instance shapes 130(2), 130(3) includes a surface finish component 221 and a position component that are completely independent of the definitional shape and its components. Such additional components allow each instance of a shape to be customized for that instance in any of a variety of different ways (e.g., so that the four wheels of a car appear at different locations within the 3-D world, one of the car wheels might be splattered with mud defined by a texture or surface finish, one of the car wheels might include a hubcap which is dented, etc.).

Instance shapes can replace a definition component in its definitional shape with a different definitional component of its own. In the FIG. 6 example, instance shape 130(2) has an anchor component 214(2) that is an instance of the definitional shape 130(1)'s anchor component 214(1)—while instance shape 130(3) has its own definitional anchor component 214(3) that overrides the definitional shape's anchor component. Thus, instance shapes can choose to reuse components from the definitional shape, add new components, and/or override definitional shape components.

Some shape components (e.g., the position component) always exist in definition form and are never instanced. Other shape components (e.g., a component that controls blending of a particular solid edge) can prevent their owning shape from being instanced. A component type table (discussed below) may be used to hold this information.

Components Are Event Driven

Referring once again to FIG. 4, the purpose of shape bus 202 is to distribute messages and events between shape components 206 and between shapes 200. In this example, shape bus 202 and variable context bus 204 each distribute messages that encode events. The events may be regarded as "action items" to shape components 206 and variable context blocks 208. A parent shape (or at the very top of the hierarchy, a user interface driven software element) can place events on shape bus 202 for response by its various shape components 206. A group component 221 can pass an event along to the shape bus(es) of other shape(s) 200. A shape component 206 can generate events internal to the shape 200 for action and response by other shape components. Draw, hit test and save are examples of events supported by shape bus 202 in this example.

Shape Data Structure

FIG. 7 shows an example detailed shape data structure corresponding to the FIG. 4 shape 200. In this detailed example, shape 200 includes a variety of data records that define the shape. A definition shape pointer 302 is used by an instance shape to point to a definition shape (if this field is null, the shape is a definition shape). Shape data structure 300 also includes a list of instance shapes 304 (if any). If the shape is a group shape, then the shape data structure 300 includes a maximum child shape ID 306 indicating the next child ID available for allocation.

Shape data structure 300 may also include a parent shape identifier 308 that points to its parent shape, and may also include a back pointer (not shown) specifying the child ID this shape is known by to its own parent. Shape data structure 300 may also set forth a shape component list 312 that is an array of shape component entries designating the components making up the shape.

A shape version number 314 may be maintained to specify the version of the software running on workstation 150 that created (and last saved) the shape. In this specific example, shape data structure 300 may also include various storage management data 316. Shape data structure 300 may also maintain a user name 318 specified by the user (this permits the user to name the shape by a mnemonic the user can more easily remember). Shape data structure 300 may further include various status flags pertaining to storage and other state information.

Figure 8:
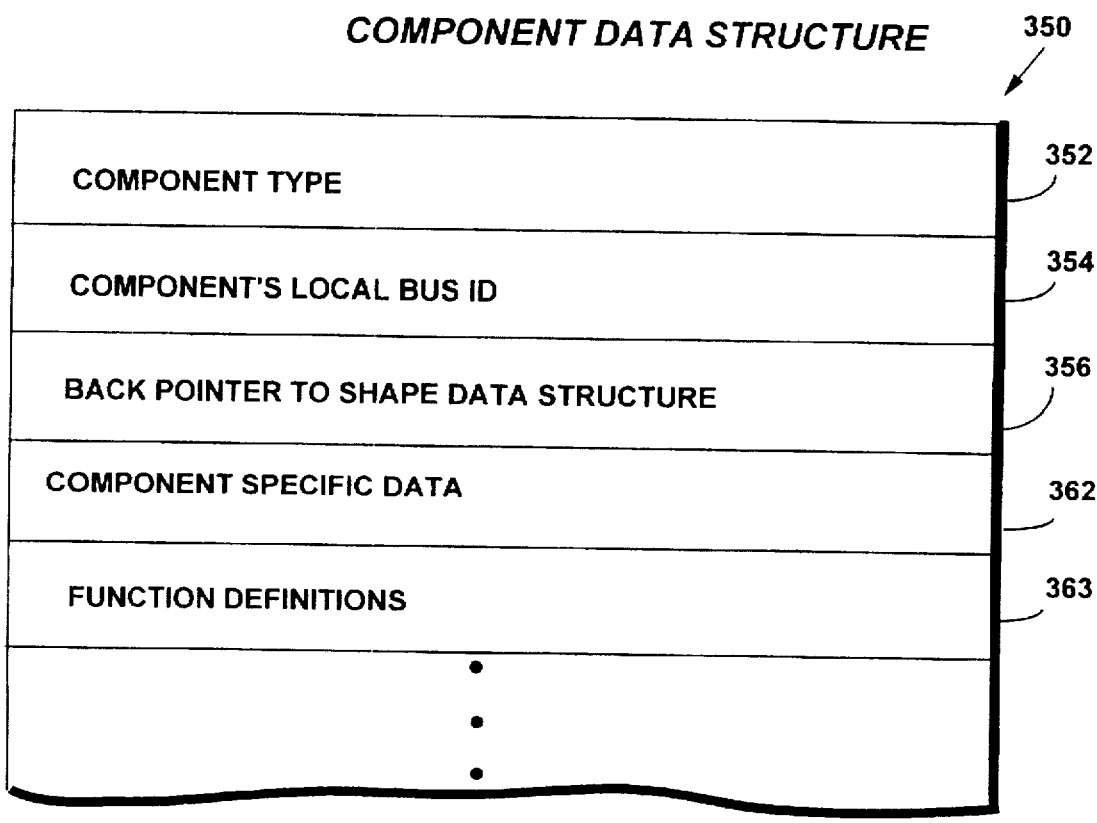
FIG. 8 is a diagram of an example component data structure.

Shape data structure 300 may also include (or reference) executable code in the form of function definitions 328 that perform certain tasks in response to messages received by the shape. Such function definitions provide a generic API to communicate with all shapes—but different shapes can implement API function calls in different ways if desired. The following is a list of example (non-exhaustive) function definitions 328 that may be supported by shape data structure 300:

General Purpose Functions
Get state flags
Get parent shape
Get shape name
Set user name
Get variable context bus
Get transform to parent coordinate system
Get component
Enumerate components
Count components of specified type
Add component Remove component
Remove all components
Functions to Manage the Connection Between Definition and Instance Shapes
  Definition shape
  Can instance
  Instance shape
  Instance shape count
  Remove instance
Broadcast/receive Functions for Shape Bus 202
  Broadcast message
  Send message
  Receive message
Component Data Structure FIG. 8 shows an example component data structure 350. In this example, component data structure 350 (which represents an example component 206 shown in FIG. 4) includes a component type specifier 352 specifying the type of component; a local bus identifier 354 specifying the identification of the component on shape bus 202; and a back pointer 356 to the corresponding shape data structure 300. The component data structure 350 also specifies function definitions 363 defining functions used to maintain the component data structure 350. Such functions may include the following:

Initialize component
  Initialize component property page
  Done component property page
  Receive message
  Set owning shape
  Functions for persistence
  Functions for variable context change notification In addition, components have a set of transaction (history) functions that allow rollbacks in the event the user changes his or her mind and cancels requested changes. These functions allow a transaction to be cancelled, deleted or undone in this example. Variable context data blocks 208 similarly allow changes to be undone on a transactional basis.

FIG. 9 shows an example component type table 364 used to keep track of information controlling component behavior. In this example, table 364 includes a pointer 365 to a variable context set of names; a "disallow instance" flag 366 that prevents the owning shape from being instanced; a "must copy on instance" flag 367 that forces a component copy to be made when a shape is instanced; and an availability flag 368 that authorizes a user to make use of this component capability (this availability flag can be used to restrict access to only a certain class of users, to prevent a certain user class from accessing the component, etc.).

Variable Context Block Data Structure

FIG. 10 shows an example data structure for a variable context data block 208. In this example, variable context data block 208 includes a pointer 380 to the associated component 206; a pointer 382 to the associated variable context bus 204; a list 384 of context dependent variables and values (and optionally, expressions); and function definitions 386.

The contents of list 384 of a variable context data block 208 depends on the particular type of variable context data block it is. Different variable context data blocks 208 store different data (e.g., a variable context data block for a sizebox component 210 stores L,W,D parameters in list 384; a variable context data block for a position component 212 stores x,y,z position information in the list, etc. These variables and values can optionally be expressed in terms of mathematical expressions (e.g., sizebox\length/4+8).

In this example, the variable context data blocks 208 may include executable code (function definitions 386) and present a unified API to the component 200 for allowing the component to control and interact with the variable context data blocks. The functions may perform a variety of different tasks associated with the variable context data blocks 208, including for example:

SetContextName
  GetContextName
  GetContextIndex
  SetNameTable
  Register
  Remove
  SetValue
  GetValue
  SetExpression
  GetExpression
  Add Callback "Callbacks" are special functions that the variable context data blocks use to inform one or more components 200 that one or more variables has changed.

The actual communications protocol (interface) over the variable context bus 204 may include the following example non-exhaustive interface definitions:

SetName
  SetParent
  AttachContext
  DetachContext

The variable context bus 204 is used to resolve names in the expressions provided by the variable context data blocks 208. For example, if a sizebox component 210 and an extrude component 216 exist on the same shape, then an expression for the blend radius (within the extrude component's variable context data block 208) can be sizebox\length/4 (so that the blend radius will change with the size box dimensions). Alternatively, the blend radius can depend on the parent shape's size box (e.g., parent\sizebox\length/4). The variable context bus 204 takes care of traversing the variable context block hierarchy and resolving names.

FIG. 10A shows an example variable context data block 208 for an anchor component 214. This example includes an x data field 370, a y data field 371, a z data field 372, a rotation x data field 373, a rotation y data field 374, a rotation z data field 375 and a rotation angle data field 376. These values specify the 3D position (translation and orientation) of an anchor point A relative to the origin O of the shape's size box (see FIG. 10B). The anchor point A thus frees the user from having to know about the actual coordinate system of the reference geometry.

The anchor point A can be used as a reference point for various uses. For example, when the shape is dropped onto another shape, the anchor point A is aligned with the point on the other shape selected by mouse pointing device 156. As another example, while the shape is being slid along another surface, the anchor point A slides along the surface. Further, the anchor point A can be used as the fixed point for expanding the shape's size box. The inertial properties of a shape can also be defined relative to the anchor point A. Motion of a shape 200 can also be applied relative to the anchor point A. Moreover, since the anchor point A need not be within a shape but instead can be defined outside of it, one can use the anchor point to define a distance offset between two shapes.

Shape Static Storage Structure

FIG. 11 shows an example of how the FIG. 4 shape 200 may be stored on a mass storage device. In the FIG. 11 example, the shape 200 is stored in two parts: a shape content file 240 and a shape data file 250. Shape content file 240 may include a shape header 242, and one or more component descriptor blocks 244, each of which corresponds to a shape component 206. The shape data file 250 includes the variable context data for each of the corresponding shape components 206. Thus, there is typically a variable context data block 252 for each of the variable context blocks 208 that defines the shape 200. Component descriptor blocks 244 include pointers that refer to the variable context data blocks 252 within the shape data file 250. Such pointers may comprise, for example, a "seek address" for the corresponding variable data block 252.

One advantage of storing the variable context data separately from corresponding component descriptor block 244 is that it becomes possible to do a variable and/or "intelligent" load of the shape 200 (e.g., to load less than all of the shape data file 250 depending on why the shape is being loaded). For example, there may be no need to load variable context data blocks 252 corresponding to physical shape component 206 if imaging is the only operation to be performed on the shape. Alternatively, there may be no need to load variable context data block 252 corresponding, for example, to the price and availability of a product unless and until the user requests such information.

In this example, when a shape 200 is saved to mass storage, each shape component 206 is responsible for writing its corresponding variable context data block 208 (along with other data internal to the shape component) into the corresponding variable data block 252 within shape data file 250.

FIG. 12 shows a detailed shape content file data structure shape content file 240 in this example includes within its shape header 242 a version number 402 and an instance count 404. Following the header, each component description block 244 is stored. Each component description block 244 may include a component type 406, an entry type (definitional or instance) 408, and a start position 416. The shape content file 240 may also, if the shape is an instance shape, include one or more instance description blocks 420 referring to the corresponding definitional shapes.

Processes for Shape Use, Manipulation and Maintenance

Figure 13:
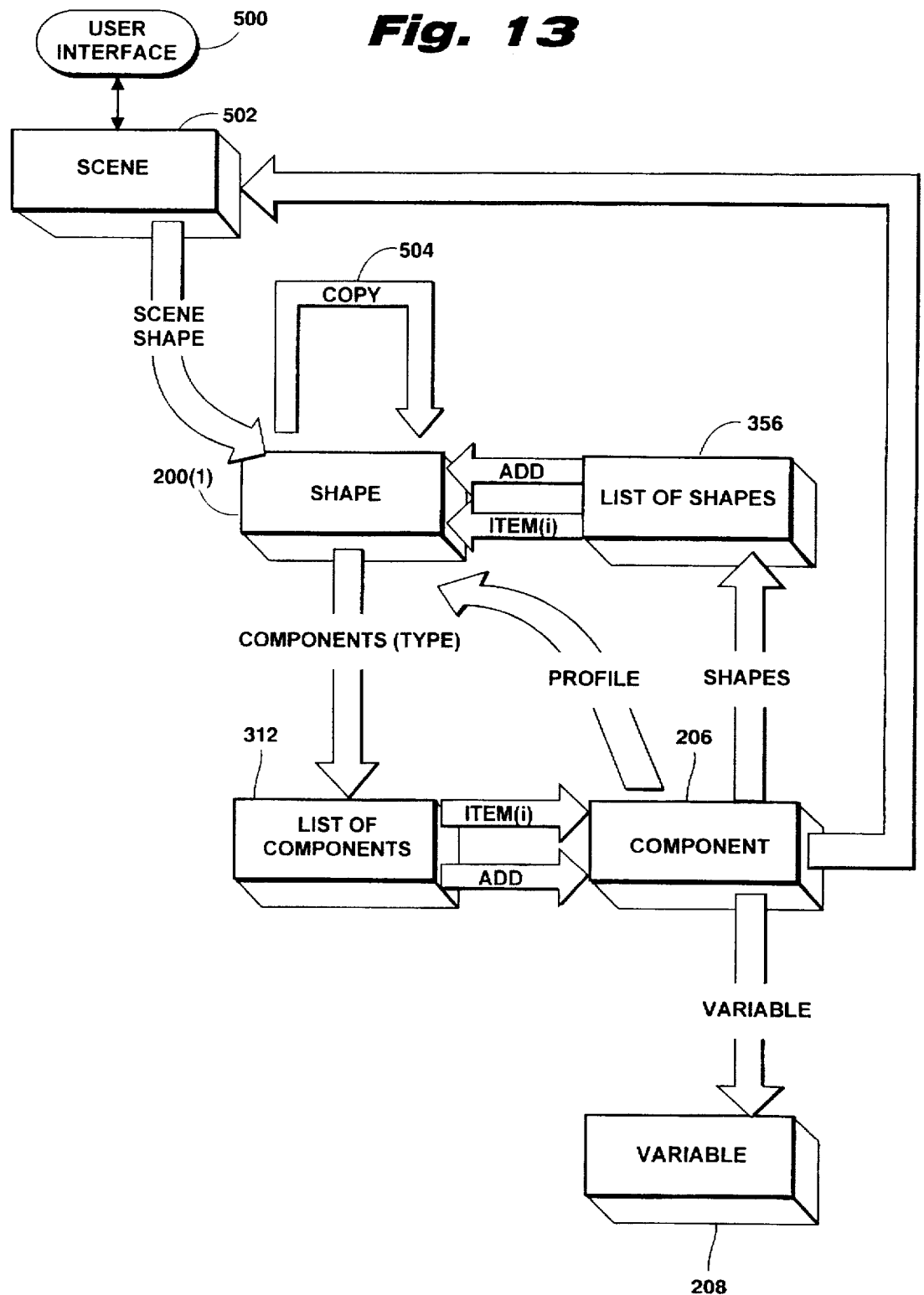
FIG. 13 shows an overall process performed by the FIG. 2 workstation to maintain and manipulate shapes.

FIG. 13 shows one example view of an overall software architecture used to use, manipulate and maintain shapes 200 in this example. A user interface 500 typically provides the stimulus for events used to create, destroy, update, use, etc., the shapes 200 by manipulating mouse pointing device 156 and/or keyboard 154. The shape processing provided in this example is hierarchical and top down, so that the stimuli from the user interface is typically provided through the scene shape 502 structure—the scene being the highest level of organization of shapes in this example. The scene shape 502 may provide events to a child shape 200(1), which may act on it itself (e.g., performing a copy operation 504), or pass the event along to its components 206 via the component list 312 it maintains. Components 206 such as a profile component 220 shown in FIG. 4 or a group component 221 shown in FIG. 5 may, in turn, reference child shapes through a shape list 356—providing recursion in the overall processing. Components 206 may also reference and/or change variable context blocks 208. Additionally, some components 206 may reference other components.

FIGS. 14–27 are flowcharts of example program controlled processes performed by workstation 150 to create, use and manipulate shapes 200. These drawings are described below in some detail.

Create New Shape

Figure 14:
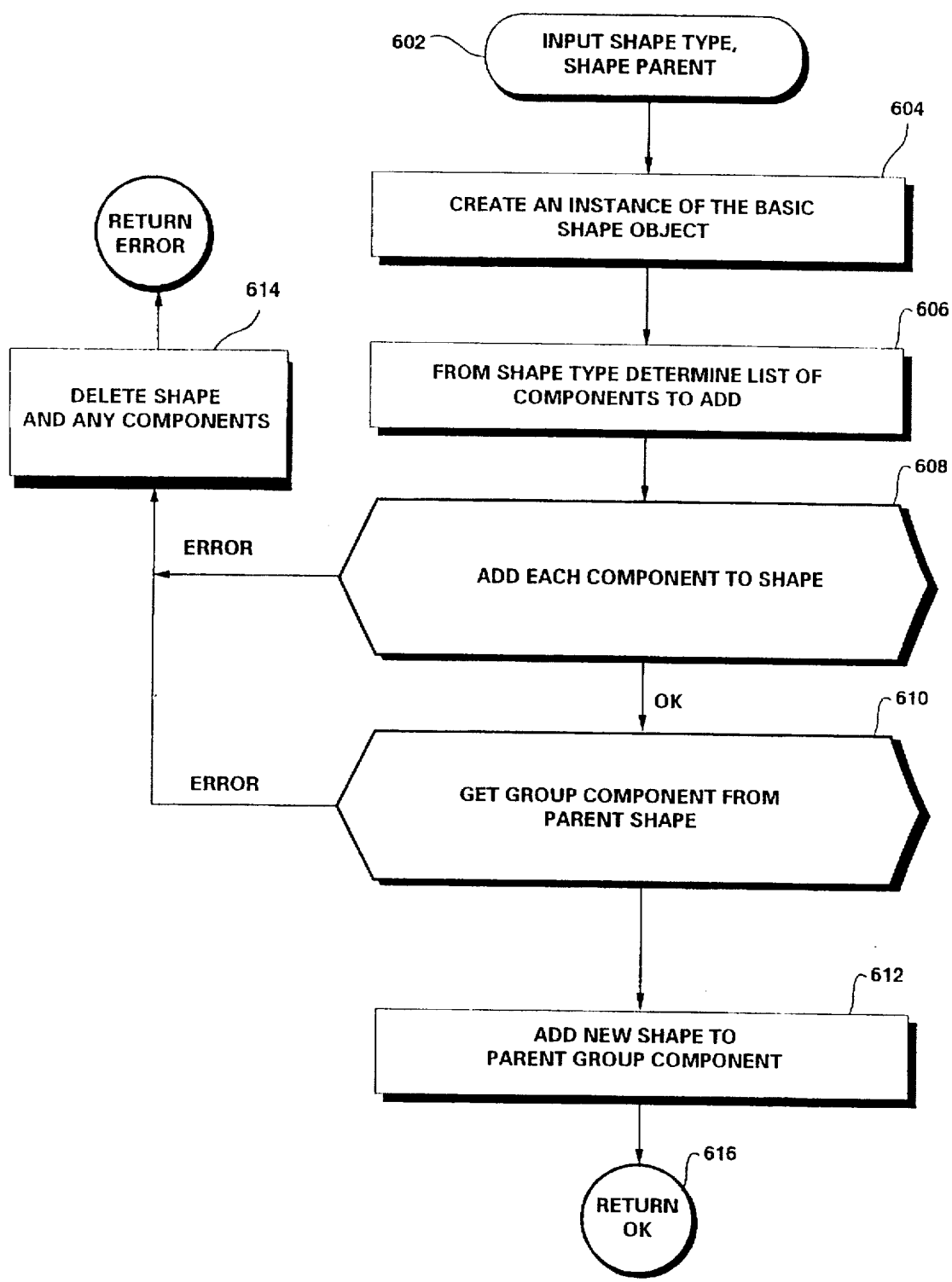
FIG. 14 shows an example process for creating a new shape.

FIG. 14 shows an example control sequence for creating a new shape 200. To create a new shape, a user first inputs shape type and shape parent via user interface 500 (this may involve, for example, moving mouse pointing device 156 to select various options displayed on display 158) (block 602). Workstation 150 then creates an instance of the basic shape data structure (object) (block 604). Workstation 150 then uses a lookup table process (for example) to determine from the specified shape type, the list of components to insert into the shape component list 312 (block 606). Workstation 150 creates corresponding component data structures 350 for each component included in the shape (block 608) (and may exit and return an error if it is not able to carry out this process). Workstation 150 may also get the group component 221 from the parent shape (block 610) and add a new child shape ID (see shape data structure 300, field 306) to the parent's shape data structure (block 612). Workstation 150 will delete the new shape data structure 300 and any components 350 if it encounters an error in performing any of tasks 608, 610, 612 (block 614), but otherwise returns with an "OK" non-error (block 616).

Add Component

Figure 15:
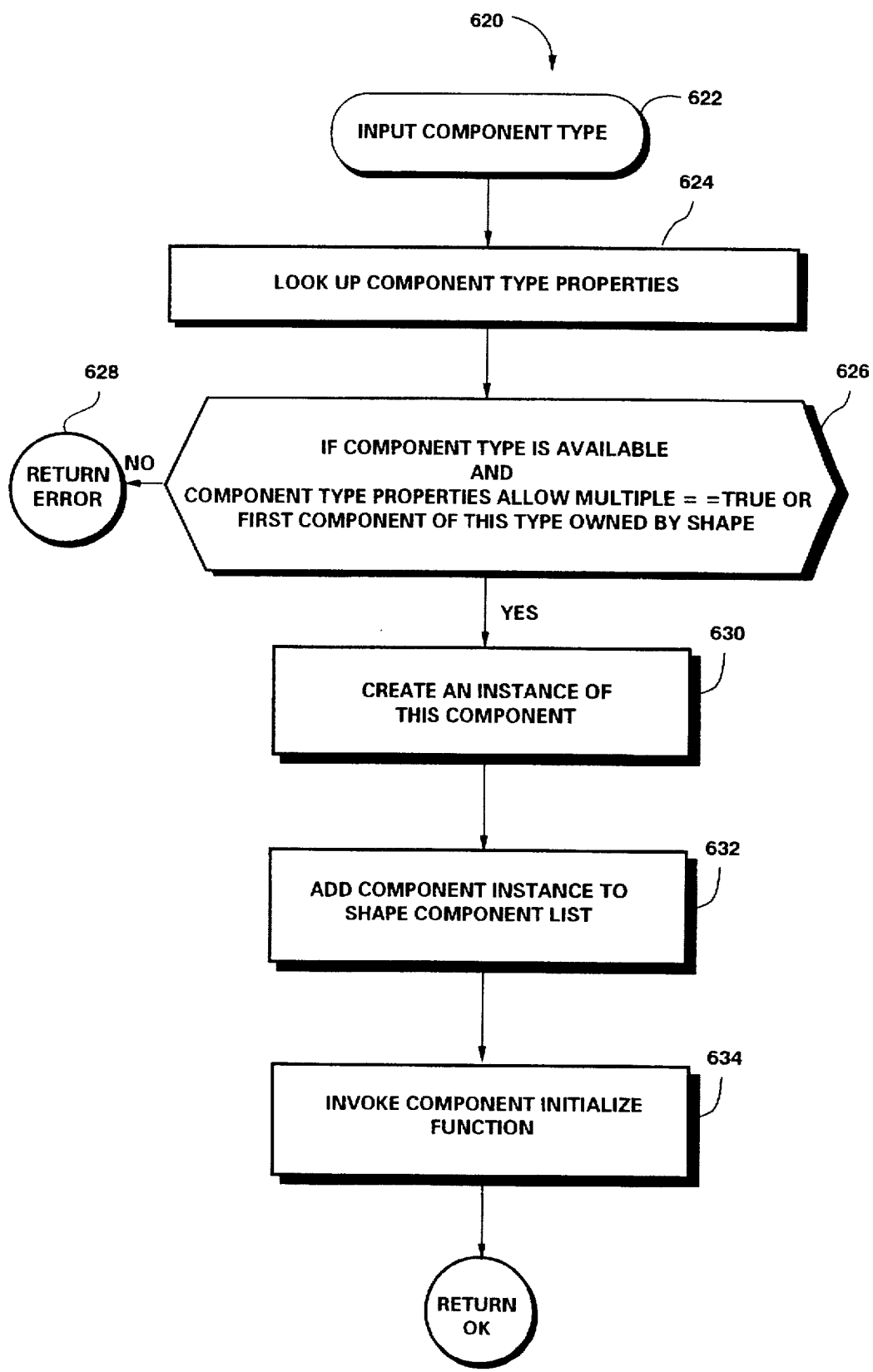
FIG. 15 shows an example process for adding a component to a shape.

FIG. 15 shows an example process performed by workstation 150 to add a component 206 to an existing shape 200. In response to user input of component type via user interface 500 (block 622), workstation 150 looks up component type properties in a lookup table (block 624). Workstation 150 then performs a test to determine whether the specified component type is available (see flag 368 of FIG. 9) and whether the pre-existing shape structure permits creation of this new component (block 626). In this example, only one copy of certain types of components per shape is permitted (e.g., a shape can have only one position component 212 and only one size box component 210). Decision block 626 ensures that improper duplicate (or other invalid types of) components are not created, and returns an error condition if the user attempts to create such components (block 628). Assuming the test of decision block 626 passes, workstation 150 creates an instance of the component data structure 350 (see FIG. 8) (block 630)—in most cases customized to include component specific data 362 peculiar to the particular type of component being created. Workstation 150 then adds the newly created component data structure 350 to the shape's component list 312 (block 632), and invokes the component's initialization function as provided within the component data structure function definition 363 (block 634).

Save Shape

Figure 16:
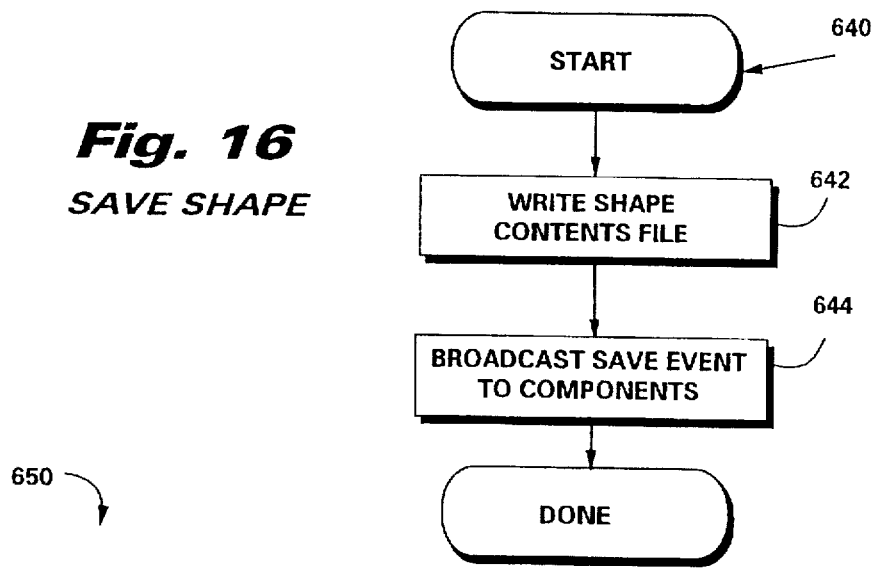
FIG. 16 shows an example process for saving a shape to mass storage.
Figure 17:
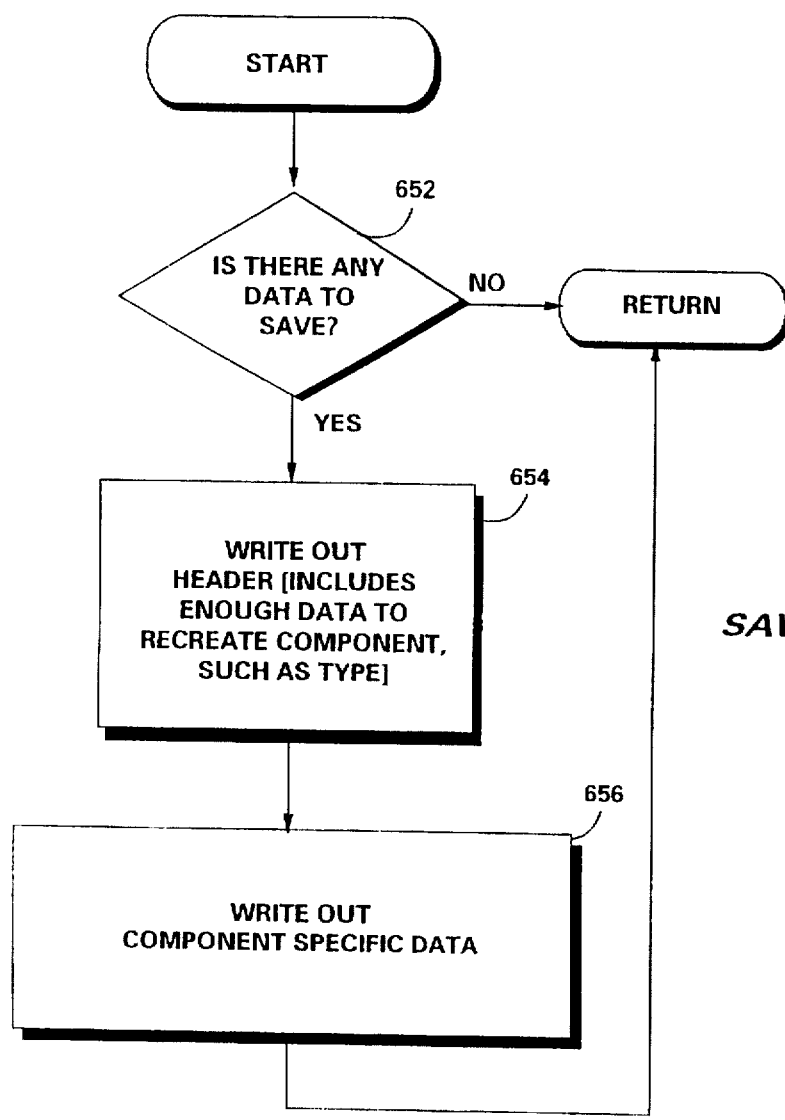
FIG. 17 shows an example process for saving a shape component.

FIGS. 16 and 17, respectively, show example processes performed by workstation 150 to save a shape 200 and a shape component 206. To save a shape (see FIG. 16), workstation 150 writes a shape content file 240 based on shape data structure 30 (block 642), and then broadcasts a "save" event to each of the shape's components 206 over shape bus 202 (block 644). In response to the broadcasted "save" event, each component independently determines whether there is any data it must save (block 652, FIG. 17). If the component data structure 350 hasn't changed since it was loaded, there is no need for it to save any data and there is nothing left to be done before exiting. On the other hand, if data has changed or been added, workstation 150 may write a new component description block 244 to the shape content file 240 (see FIG. 12) (block 654) and then typically will write a new variable context data block 252 to the shape data file 250 to provide the component specific variable context data (block 656) (the component can also save other private data to the data file at this time).

Load Shape

Figure 18:
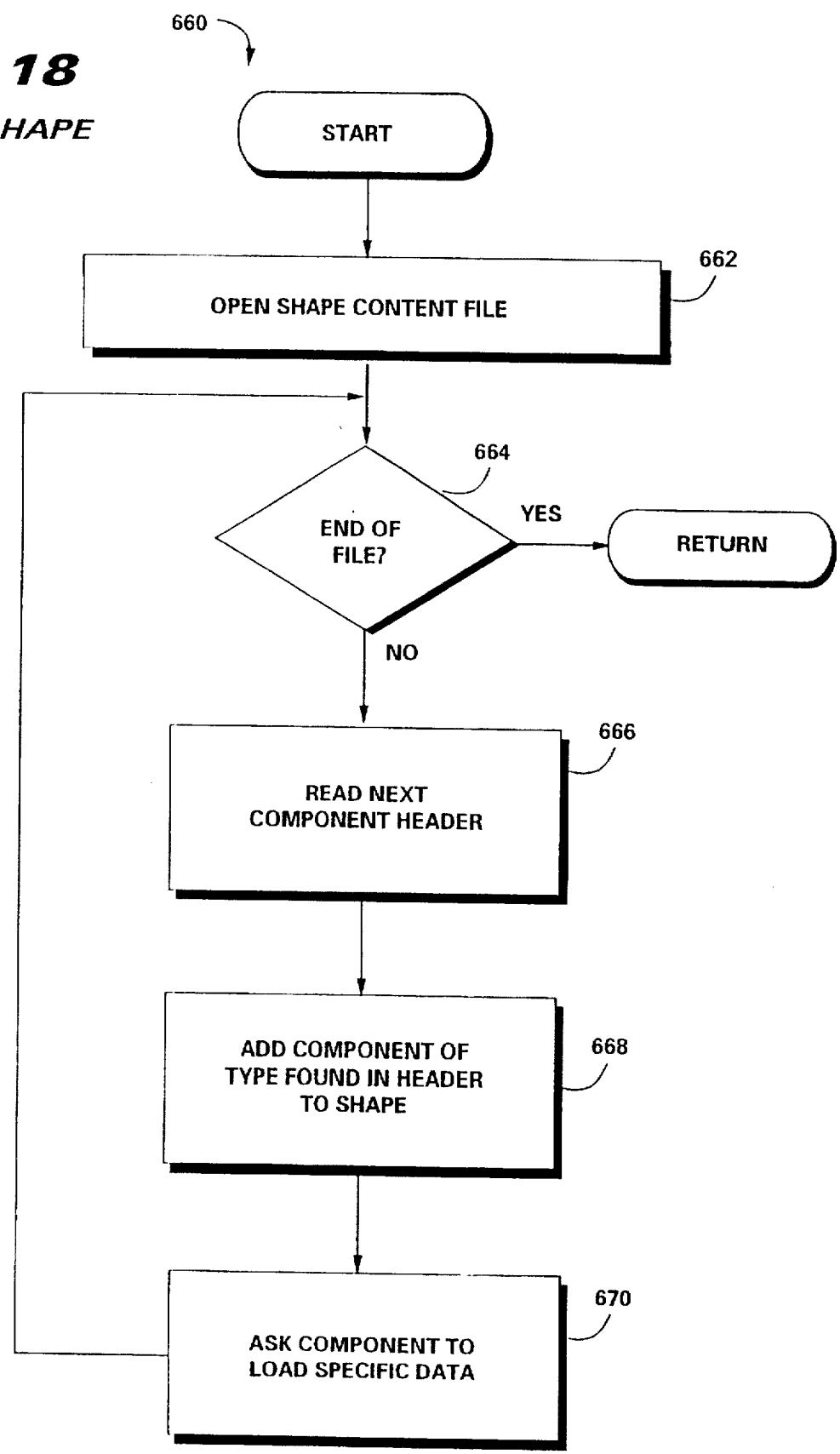
FIG. 18 shows an example process for loading a shape.

FIG. 18 shows an example process 660 performed by workstation 150 to load a shape 200. To load a shape, workstation 150 opens the shape content file 240 corresponding to the shape (block 662), and begins creating shape data structure 300 in memory (RAM 164). After reading shape header 242, workstation 150 reads each component description block 244 (block 666), creates a corresponding component data structure 350 in RAM corresponding to the component (block 668), and then asks the newly-created component itself to load its specific variable context data from shape data file 250 (and any other private data that was stored) (block 670). This process continues until all components descriptor blocks 244 within shape content file 240 have been processed (as tested for by decision block 664).

FIG. 18A shows a more detailed example process for loading a shape 200 that allows selective loading of components. In this more detailed load shape process 680, workstation 150 opens a shape content file 240 (block 662) and then reads the shape header 242 to perform a version check (block 682). This "version number" 402 maintained within the shape content file 240 specifies the version of executable software performed by workstation 150 when the shape content file 240 was last saved—and is maintained to provide upward compatibility with new software versions. Workstation 150 then reads the shape instance count record 404 for definition shapes (block 684), and also reads the user name field 405 (block 686). Workstation 150 may next set a "load in progress" status bit within the newly-created shape data structure 300 (block 688) (this bit may be maintained within state flags 310 and/or storage management data 316, see FIG. 7). Process 680 next creates component data structures 350 corresponding to the shape 200 by reading each of the component description blocks 244 in turn (block 690). In this example, however, instead of loading all components immediately, workstation 150 may perform a selective component load to load only those components that are immediately required. To perform such a selective component load, workstation 150 may load only those components that, for example, are so frequently used that it doesn't make sense not to load them (for example, the size box is always loaded in this example implementation). The now-loaded shape 200 may then broadcast an "all components loaded" event over shape bus 202 (block 694), and the "load in progress" bit may then be reset (block 696).

Since the load shape process 680 does not necessarily load all components of shape 200, a process for loading components on demand is also provided in this example.

Figure 19:
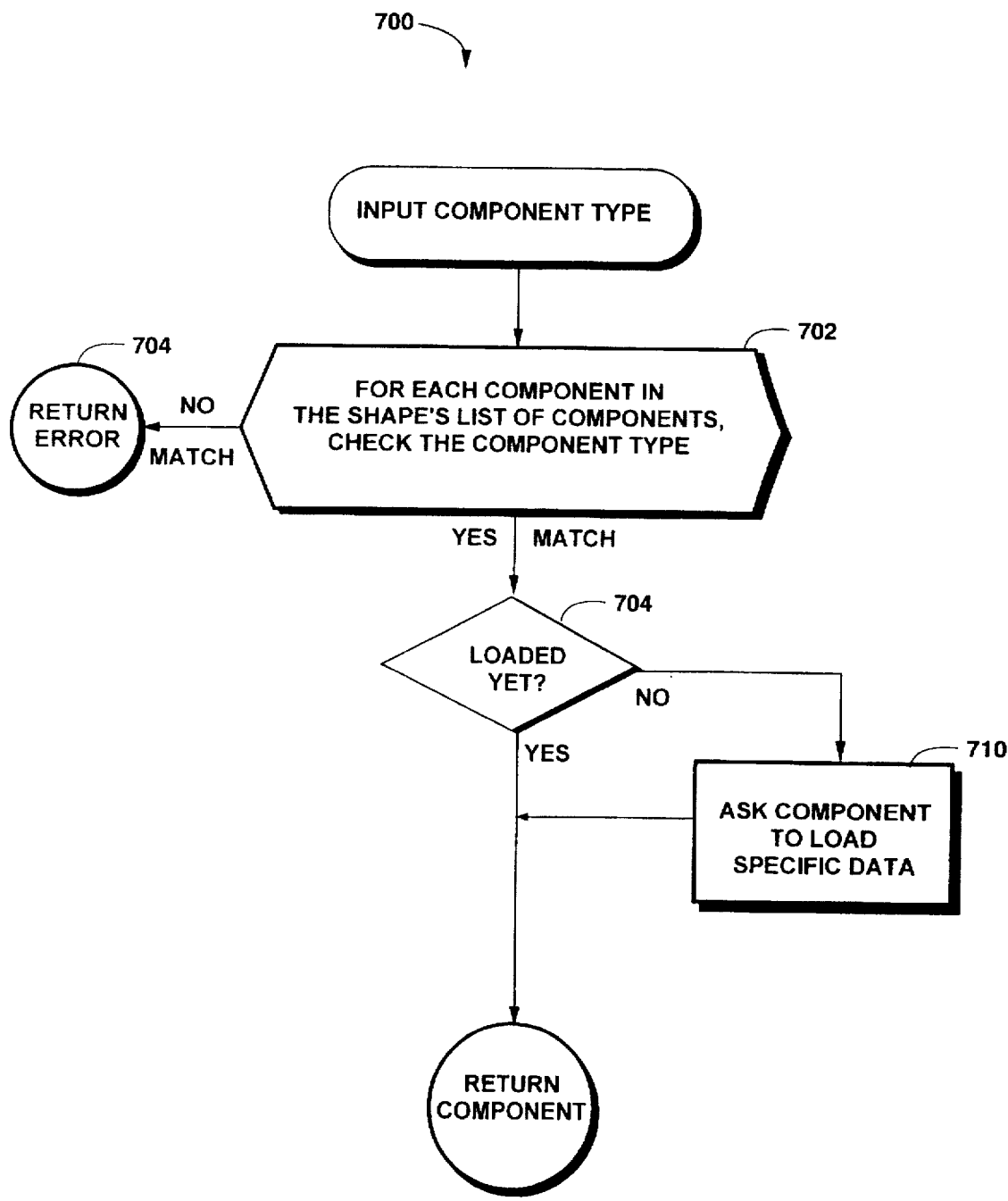
FIG. 19 shows an example process for getting a shape component.

FIG. 19 is a flowchart of an example load component on demand ("get component") process 700. In this example, workstation 150 executing one of the functions defined within the shape data structure function definitions 320 analyzes first the shape component list 312 to determine whether the requested component is defined for this shape 200 (block 702). If it is not, there is no component to load and the process returns with an error (block 704). On the other hand, if the component required is defined for this shape, process 700 determines whether the component is yet loaded (decision block 704). If the component is already loaded, nothing further needs to be done. If the component is not yet loaded, on the other hand, ("no" exit to decision block 704), then the process 700 sends a message to the newly created component 206 to retrieve its component specific data and variable context data from shape data file 250 (block 710).

Broadcast Event

Figure 20:
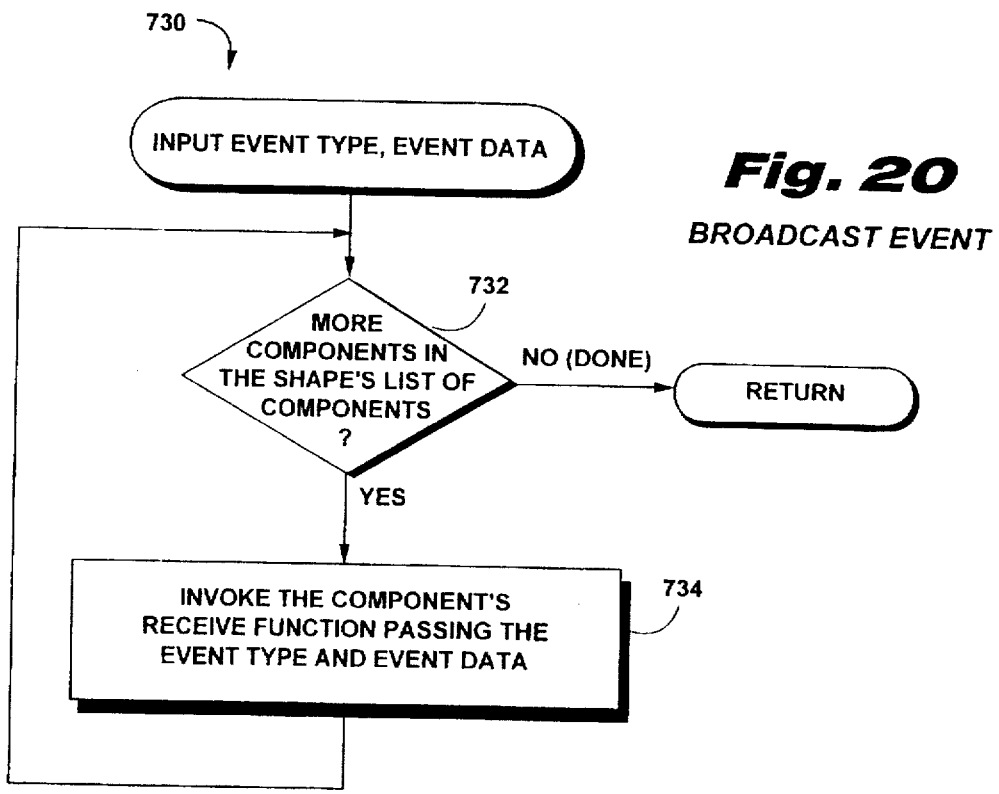
FIG. 20 shows an example process for broadcasting an event.
Figure 25:
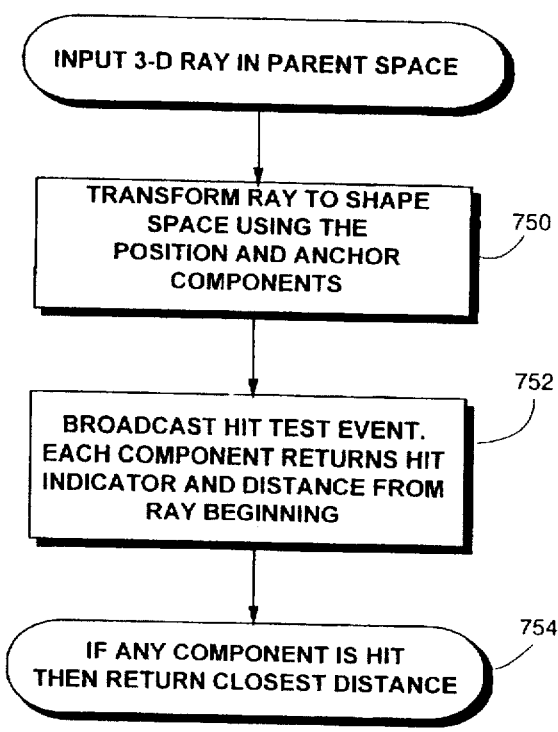
FIG. 25 shows an example process for a "hit test" for a terminal (non-group) shape.
Figure 23:
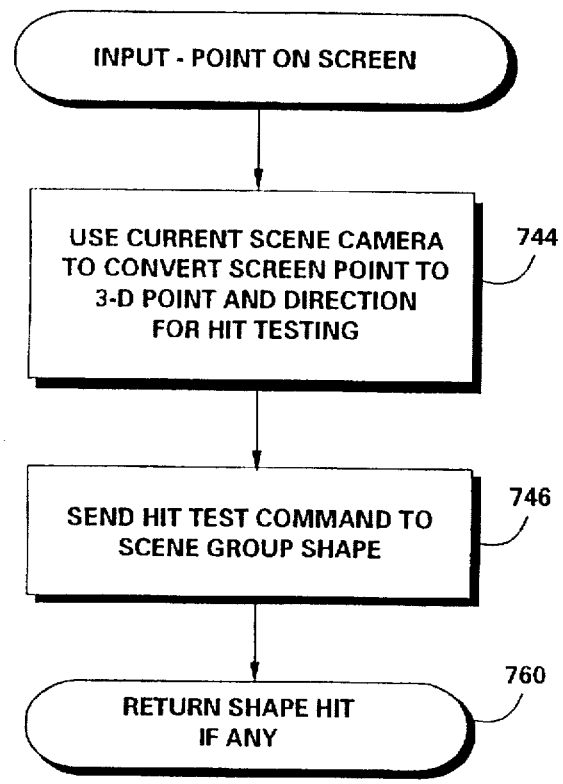
FIG. 23 shows an example process for allowing a user to select a shape.

FIG. 20 shows an example process 730 a shape 200 performs to broadcast an event over its shape bus 202 to each of its components 206. In response to receipt of event parameters (e.g., event type and event data), a shape 200 sends a message to each component within its shape component list 312 that invokes the component's receive function (block 732). This process continues until all components' receive functions have been invoked (as tested for by the "end" exit to decision block 732). For each component, the shape 200 invokes the component's receive function by passing the event type and event data to the component (block 734). Each individual component will respond as required to the event depending upon the event type and event data. For example, some components will ignore certain events and respond only to certain others. Components may respond to events in a variety of ways, such as, for example, to modify data, to send a message over shape bus 202, to propagate a message to child shapes, etc.

Draw Shape

FIG. 21 shows an example process 720 for drawing a shape 200. In this example, a shape draw is divided into three different phases: a pre-draw phase, a draw phase and a post-draw phase—each having a corresponding event. The shape 200 first broadcasts a pre-draw event which propagates over the shape bus 202 of each shape within the scene (block 722). This pre-draw event is acted upon only by those components 206 which need to alter the graphics engine state. For example, a surface finish component 221 in this example responds to a pre-draw event by sending surface finish to the graphics engine—meaning that subsequent draw surface calls will get the correct surface finish.

Once the graphics engine state has been defined correctly in response to the pre-draw event broadcast by block 722, then the shape 200 may issue a "draw" event 724 that actually causes the shapes images to be rendered on display 158. In response to the draw event, components such as the facet component 218 (the component which holds 3-D facet data) will send drawing objects to the graphics engine for rendering. The group component 221 of each group shape will propagate the draw event to each of the shape's child shapes so that these events will propagate down throughout the entire hierarchical tree structure—with each shape in essence "drawing itself" by providing surface objects to the graphics engine for rendering on the display 158.

Once the draw event has been executed, the shape 200 may issue a post-draw event (block 726) that restores the graphics engine state. In this example, every component that responds to the pre-draw event needs to perform an inverse operation in response to the post-draw event.

Shape Modification

FIG. 22 shows an example process 740 for allowing a user to modify a shape 200. Once a shape has been created and loaded as described above, the user may wish to modify the shape (e.g., to change its size). In this example, the user may select a shape by operating mouse pointing device 156 to point to a displayed shape on display 158 and to then "click" on the shape (block 742). This process invokes a "select shape" process shown in more detail in FIG. 23. In accordance with this example "select shape" process, workstation 150 uses the current scene camera to convert (transform) the 2-D screen position of the mouse pointing device cursor to a 3-D point within the 3-D scene and associated direction (vector) (block 744). The select shape process 742 then generates and sends a "hit test" event to the scene or group shape (block 746). This "hit test" event allows each shape within the scene to itself determine whether the cursor at the time of the user's "click" is pointing to it.

Figure 24:
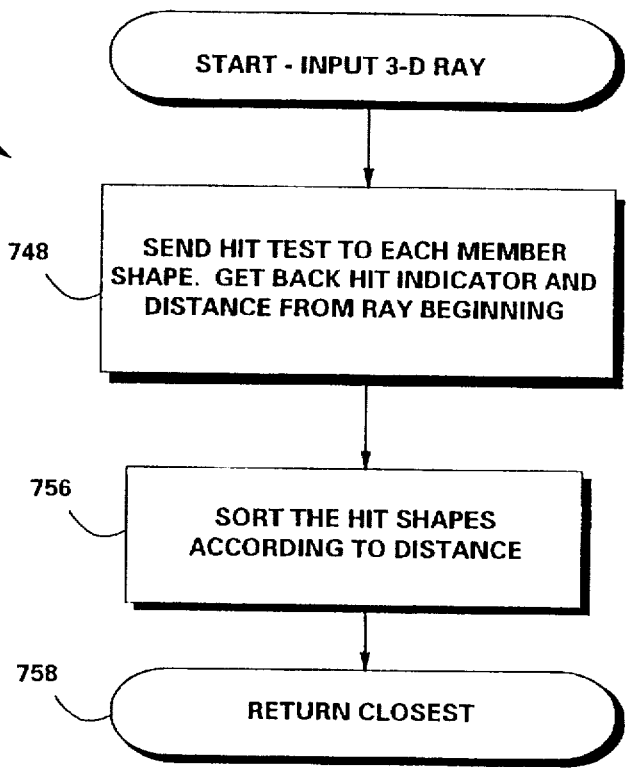
FIG. 24 shows an example process for a "hit test" pertaining to a group shape.

FIG. 24 shows an example process for a "hit test" event 746 performed by a group shape 200. As mentioned above, this "hit test" event includes, as a parameter, a 3-D vector within the scene. The group shape 200 sends the "hit test" event and associated parameter to each child shape (block 748). Recipient child shapes 200 perform the example process shown in FIG. 25. They transform the vector into shape space using both the position component 212 and the anchor component 214 (block 750). The shape then broadcasts a "hit test" event on its shape bus 202 (block 752). In response to this "hit test" event, each component 206 returns a "hit indicator" and distance from the beginning of the vector (block 752). This is essentially an intersection test. If any component 206 is hit by the vector, then the component returns to the closest distance between it and the vector (block 754). Referring once again to FIG. 24, the "hit test" processing for the group shape receives the hit indicators and associated distances, and sorts them according to distance to find the one with the smallest distance (block 756). The hit test group shape process 746 returns the designation of the shape with the closest distance (block 758) to the select shape process (see FIG. 23), which process returns the shape hit (if any) to the calling process (block 760)—see FIG. 22.

Once a shape has been selected, the FIG. 22 example process accesses its size box component 210. In this example, the size box component specifies x, y and z dimensions of the maximum extent of the corresponding shape—and thus defines a parallelepiped (e.g., a box) in space that may enclose the defined shape. The process 740 then draws the size box around the shape, and displays handles on each of the six faces of the size box (block 762)—see FIG. 22A illustration for an example. If the user uses a "drag" technique (once again, by manipulating mouse pointing device 156) to "pull" a handle to change an associated size box dimension, (block 764), workstation 150 invokes a function for the shape 200 that controls size box component 210 to change its variable context data as specified by the position of the cursor controlled by the mouse pointing device (block 766). The variable context data block 208 invokes its callback function to inform the shape 200 that a change has happened. In addition, if this variable is used in any expression, then the variable context data block 208 which owns the expression will also send out a callback—and so on recursively. Workstation 150 then sends an update event to the scene group shape (block 768) informing the group shape that the shape data has changed. Update Shape FIG. 26 shows an example process 770 for updating a shape 200. In this example process, workstation 150 first determines whether the shape or any child shape has been modified since the update shape function has last been called (block 772). If there has been no modification, then there is no need to update the shape. On the other hand, if the shape has been modified ("yes" exit to decision block 772), then process 770 determines whether this shape has been modified (block 774). If this shape has been modified, then workstation 150 must rebuild this shape from its shape data structure 300 description (block 776), and then sends an update message to each of the shape's children so they may perform a corresponding rebuild operation (block 778).
Sculpt a Shape FIG. 27 shows an example process 780 to sculpt a shape 200. In this example process, the user may drop a "sculpt-ing" shape (e.g., a hole) onto another shape using a "drag and drop" technique with mouse pointing device 156 (block 782). In response to this action by the user, workstation 150 uses the select shape routine (see FIG. 23) to determine which shape is to have the hold drilled into it (block 784). Workstation 150 adds the hole to the shape by adding the hole shape to the shape component list 312 (see FIG. 7) and specifying as the position of this new child shape (via position component 212 of the child shape) the point on the selected shape 200 that was "hit" by the cursor (block 786). Note that the anchor component 214 is not changed in this example—and thus the author of the sculpting shape can specify the orientation of the hole relative to the shape it is being dropped on. Workstation 150 then sends an "update" event to the scene group shape (block 788)—thereby causing the corresponding group shape data structure 300 to change.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A 3-D computer graphics arrangement of the type that allows a user to interactively position 3-D objects within 3-D scenes, the arrangement comprising:

an input device operable by the user;

a storage device that stores a data representation defining at least one three dimensional object, said stored data representation providing at least the following components describing said 3-D object:

a visual component defining at least one visual characteristic of said 3-D object, a physical component defining at least one physical characteristic of the 3-D object, a functional component defining at least one functional characteristic of the 3-D object, and a behavioral component defining at least one behavioral characteristic of the 3-D object; and a processor coupled to said input device and said storage device, said processor allowing said user to interactively position said 3-D object within a 3-D scene, said processor visually rendering said 3-D object in accordance with said user operation of said input device and in accordance with at least one of said visual, physical, functional and behavioral components.

2. An arrangement as in claim 1 wherein:

the physical component defines an anchor; and the processor includes means for defining a shape coordinate system, and means for defining an attachment point the position of which is responsive to said anchor defined by said physical component, the anchor specifying the translation and orientation of the attachment point relative to the shape coordinate system.

3. An arrangement as in claim 1 wherein the intelligent processing means comprises means for processing a collection of components at least in part representing the 3-D object.

4. An arrangement as in claim 1 wherein the intelligent processing means comprises means adapted to receive at least one component defining an additional intelligent property.

5. An arrangement as in claim 1 wherein the processor comprises means for establishing an operative, automatic interconnection between said components.

6. An arrangement as in claim 1 wherein said physical component defines a three-dimensional size box.

7. An arrangement as in claim 1 wherein said physical component defines a position of the object in three-dimensional space.

8. An arrangement as in claim 1 wherein said physical component defines precise 3D dimensions of the object.

9. An arrangement as in claim 1 wherein said representation further includes at least one further component defining a hierarchical tree structure of sub-objects together defining the object.

10. An arrangement as in claim 1 wherein at least one of the components defines a linked list referencing at least one additional object data structure.

11. An arrangement as in claim 1 wherein the processor includes means defining an extensible shape bus for accepting said components, the shape bus distributing messages among the plural components.

12. An arrangement as in claim 1 further including intelligent loading means for selectively loading a subset of the components on an as-needed basis.

13. An arrangement as in claim 1 wherein said processor visually renders the 3-D object being dropped into said 3-D scene, said processor intelligently rendering said 3-D object based on at least one of said components, as said 3-D object is dropped into said 3-D scene.

14. An arrangement as in claim 13 wherein said processor intelligently resizes said 3-D object relative to said scene as said 3-D object drops into said scene.

15. An arrangement as in claim 13 wherein said 3-D scene includes plural additional 3-D objects, and said processor intelligently establishes at least one relationship between said 3-D object and said plural additional 3-D objects as said 3-D object drops into said scene.

16. An arrangement as in claim 15 wherein said 3-D scene includes plural additional 3-D objects, and said processor further manipulates said scene while intelligently maintaining said established relationship between said 3-D object and said plural additional 3-D objects.

17. An arrangement as in claim 1 wherein said processor visually renders said 3-D object being dropped onto and landing on at least one further 3-D object within said scene, said processor deriving information from at least one of said components to intelligently orient said 3-D object relative to said further 3-D object as said 3-D object lands on said further 3-D object.

18. An arrangement as in claim 17 wherein said processor intelligently snaps said landing 3-D object to at least one feature of said further 3-D object.

19. An arrangement as in claim 1 wherein said processor visually renders said 3-D object being dragged across a surface defined by at least one further 3-D object within said scene, said processor deriving information from at least one of said components to intelligently slide said 3-D object across said surface.

20. An arrangement as in claim 19 wherein said processor intelligently snaps said sliding 3-D object to at least one feature of said further 3-D object.

21. An arrangement as in claim 19 wherein said processor renders said 3-D object in graphically shaded form while it is being dragged in response to user operation of said input device.

22. An arrangement as in claim 19 wherein said processor renders said 3-D object in vector hidden line form while it is being dragged in response to user operation of said input device.

23. An arrangement as in claim 1 wherein said processor visually renders said 3-D object being dropped onto and merging with at least one further 3-D object, said processor deriving information from at least one of said components to intelligently merge said 3-D object with said further 3-D object as said 3-D object lands on said further 3-D object.

24. An arrangement as in claim 23 wherein said processor intelligently blends at least part of said 3-D object with said further 3-D object, based on at least one of said components.

25. An arrangement as in claim 23 wherein said processor intelligently merges said landing 3-D object with said further 3-D object using a boolean operator, based on at least one of said components.

26. An arrangement as in claim 1 wherein said processor renders said 3-D object in plural different forms appropriate for visualization, modeling and simulation, based on said components.

27. An arrangement as in claim 26 wherein said processor renders said plural different forms of said 3-D object in the same scene, and allows said plural forms to intelligently interact with one another.

28. An arrangement as in claim 27 wherein said processor dynamically alters at least one of said data representation components at run time.

29. An arrangement as in claim 1 wherein said processor allows said user to alter said components by operating said input device.

30. An arrangement as in claim 1 wherein said storage device stores a data representation of at least one additional object, and said processor alters said components based on at least one relationship with said additional object.

31. An arrangement as in claim 1 wherein said processor resizes said 3-D object while allowing said physical characteristic defined by said physical component to persist in describing said resized 3-D object.

32. An arrangement as in claim 1 wherein said processor relates said 3-D object to at least one further 3-D object in said scene while allowing said physical characteristic defined by said physical component to persist in describing said related 3-D object.

33. An arrangement as in claim 1 wherein said processor creates plural instances of said 3-D object based on said components, and determines which of said components to apply to each of said plural instances.

34. An arrangement as in claim 33 wherein said data representation includes information which specifies which of said components to apply to each of said plural instances.

35. An arrangement as in claim 1 wherein said processor dynamically alters at least one of said data representation components at run time.

36. An arrangement as in claim 1 wherein said processor incrementally loads said components from said storage device on an as-needed basis.

37. An arrangement as in claim 1 wherein said processor incrementally loads said components from said storage device in response to said user operation of said input device.

38. In a 3-D computer graphics arrangement of the type that allows a user to interactively position 3-D objects within 3-D scenes, a method of processing 3-D objects comprising:
   (a) storing a data representation defining at least one 3-D object, said representation including at least the following components describing said 3-D object:
   a visual component defining at least one visual characteristic of said 3-D object,
   a physical component defining at least one physical characteristic of the 3-D object,
   a functional component defining at least one functional characteristic of the 3-D object, and a behavioral component defining at least one behavioral characteristic of the 3-D object;

(b) receiving signals from user operation of an input device; and (c) visually rendering said 3-D object in accordance with said received signals and at least one of said visual, physical, functional and behavioral components.

39. A method as in claim 38 wherein said rendering step (c) includes the steps of visually rendering the 3-D object being dropped into said 3-D scene, and intelligently rendering said 3-D object based on at least one of said components, as said 3-D object is dropped into said 3-D scene.

40. A method as in claim 39 wherein said rendering step (c) intelligently resizes said 3-D object relative to said scene as said 3-D object drops into said scene.

41. A method as in claim 39 wherein said 3-D scene includes plural additional 3-D objects, and said rendering step (c) includes the step of intelligently establishing at least one relationship between said 3-D object and said plural additional 3-D objects as said 3-D object drops into said scene.

42. A method as in claim 39 wherein said 3-D scene includes plural additional 3-D objects, and said rendering step (c) includes the step of said manipulating said scene while intelligently maintaining said established relationship between said 3-D object and said plural additional 3-D objects.

43. A method as in claim 38 wherein said rendering step (c) includes the step of visually rendering said 3-D object being dropped onto and landing on at least one further 3-D object, said deriving information from at least one of said components to intelligently orient said 3-D object relative to said further 3-D object as said 3-D object lands on said further 3-D object.

44. A method as in claim 43 wherein said rendering step (c) includes the step of intelligently snapping said landing 3-D object to at least one feature of said further 3-D object.

45. A method as in claim 38 wherein said rendering step (c) includes the steps of visually rendering said 3-D object being dragged across a surface defined by at least one further 3-D object, and deriving information from at least one of said components to intelligently slide said 3-D object across said surface.

46. A method as in claim 45 wherein said rendering step (c) includes the step of intelligently snapping said sliding 3-D object to at least one feature of said further 3-D object.

47. A method as in claim 46 wherein said rendering step (c) includes the step of rendering said 3-D object in graphically shaded form while it is being dragged.

48. A method as in claim 46 wherein said rendering step (c) includes the step of rendering said 3-D object in vector hidden line form while it is being dragged.

49. A method as in claim 38 wherein said rendering step (c) includes the step of visually rendering said 3-D object being dropped onto and merging with at least one further 3-D object, and deriving information from at least one of said components to intelligently merge said 3-D object with said further 3-D object as said 3-D object lands on said further 3-D object.

50. A method as in claim 49 wherein said rendering step (c) includes the step of intelligently blending said 3-D object with said further 3-D object.

51. A method as in claim 49 wherein said rendering step (c) includes the step of intelligently merging said landing 3-D object with said further 3-D object using a boolean operator.

52. A method as in claim 38 wherein said rendering step (c) includes the step of rendering said 3-D object in plural different forms appropriate for visualization, modeling and simulation, based on said components.

53. A method as in claim 52 wherein said rendering step (c) includes the step of rendering said plural different forms of said 3-D object in the same scene, and allowing said plural forms to intelligently interact with one another.

54. A method as in claim 53 wherein said rendering step (c) includes the step of dynamically altering at least one of said data representation components at run time.

55. A method as in claim 38 wherein said rendering step (c) includes the step of allowing a user to alter said components by operating said input device.

56. A method as in claim 38 further including:

storing a data representation on at least one additional object, and altering said components based on at least one relationship with said additional object.

57. A method as in claim 38 wherein said rendering step (c) includes the step of resizing said 3-D object while allowing said physical characteristic defined by said physical component to persist in describing said resized 3-D object.

58. A method as in claim 38 wherein said rendering step (c) includes the step of relating said 3-D object to at least one further 3-D object while allowing said physical characteristic defined by said physical component to persist in describing said resided 3-D object.

59. A method as in claim 38 wherein said rendering step (c) includes the steps of creating plural instances of said 3-D object based on said components, and determining which of said components to apply to each of said plural instances.

60. A method as in claim 59 wherein said rendering step (c) includes the step of including, within said data representation, additional information which specifies which of said components to apply to each of said plural instances.

61. A method as in claim 38 wherein said rendering step (c) includes the step of dynamically altering at least one of said data representation components at run time.

62. A method as in claim 38 wherein said rendering step (c) includes the step of incrementally loading said components from said storage device on an as-needed basis.

63. A method as in claim 38 wherein said rendering step (c) includes the step of incrementally loading said components in response to user operation of said input device.

* * * * *